(12) United States Patent
Stoessel et al.

(10) Patent No.: US 9,627,632 B2
(45) Date of Patent: Apr. 18, 2017

(54) MATERIALS FOR ORGANIC ELECTROLUMINESCENT DEVICES

(75) Inventors: Philipp Stoessel, Frankfurt am Main (DE); Hermann Mayer, Tuebingen (DE); William Kaska, Goleta, CA (US)

(73) Assignee: Merck Patent GmbH (DE)

( * ) Notice: Subject to any disclaimer, the term of this patent is extended or adjusted under 35 U.S.C. 154(b) by 721 days.

(21) Appl. No.: 13/636,495

(22) PCT Filed: Feb. 17, 2011

(86) PCT No.: PCT/EP2011/000766
§ 371 (c)(1),
(2), (4) Date: Sep. 21, 2012

(87) PCT Pub. No.: WO2011/116857
PCT Pub. Date: Sep. 29, 2011

(65) Prior Publication Data
US 2013/0009118 A1  Jan. 10, 2013

Related U.S. Application Data

(60) Provisional application No. 61/316,619, filed on Mar. 23, 2010.

(51) Int. Cl.
*H01L 51/54* (2006.01)
*C09K 11/06* (2006.01)
(Continued)

(52) U.S. Cl.
CPC .......... *H01L 51/0087* (2013.01); *C09B 57/00* (2013.01); *C09B 57/10* (2013.01); *C09K 11/06* (2013.01); *H01L 51/0085* (2013.01); *H01L 51/5012* (2013.01); *C09K 2211/1029* (2013.01); *C09K 2211/185* (2013.01); *H01L 51/0067* (2013.01); *H01L 51/0071* (2013.01); *H01L 51/0094* (2013.01); *H01L 51/5016* (2013.01); *Y02E 10/549* (2013.01); *Y02P 70/521* (2015.11)

(58) Field of Classification Search
CPC  C07F 15/0033; C07F 15/004; C07F 15/0086; C07F 15/0093; H01L 51/0084–51/0088; H01L 51/50; H01L 51/5012; H01L 51/5016; C09K 11/06; C09K 2211/1044; C09K 2211/185
See application file for complete search history.

(56) References Cited

U.S. PATENT DOCUMENTS 8,187,729 B2  5/2012  Murakami et al.
8,304,542 B2  11/2012  Stossel et al.
(Continued)

FOREIGN PATENT DOCUMENTS

DE  10103244 A1  8/2002
JP  2008-523004 A  7/2008
(Continued)

OTHER PUBLICATIONS

Garner et al. "Luminescent platinum complexes with terpyridine ligands forming 6-membered chelate rings: advantageous and deleterious effects in N^N^N and N^C^N -coordinated complexes." Inorg. Chem. 2010, vol. 49, pp. 476-487.*
(Continued)

*Primary Examiner* — Marie R. Yamnitsky
(74) *Attorney, Agent, or Firm* — Drinker Biddle & Reath LLP

(57) ABSTRACT

An uncharged compound of the formula (1)

$$M(L)_n(L')_m(L'')_o \qquad \text{Formula (1)}$$

containing a substructure $M(L)_n$ of the formula (3) or (4)

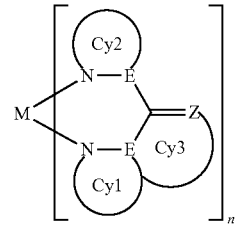

Formula (3)

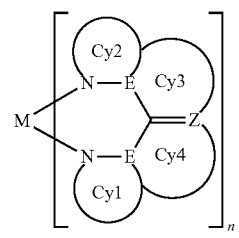

Formula (4)

M is a transition metal;
E is identical or different on each occurrence and is in each case a sp²-hybridized carbon or nitrogen atom;
Z is identical or different on each occurrence and is in each case $C(R)_2$ or NR;
Cy1 and Cy2 are identical or different on each occurrence and are in each case a substituted or unsubstituted heterocycle which coordinates to M via the N atom and may have a bond to the group Z. The compound can also be used in an oligomer, polymer, dendrimer or an electronic component.

15 Claims, No Drawings

(51) Int. Cl.
    *H01L 51/00*     (2006.01)
    *C09B 57/00*     (2006.01)
    *C09B 57/10*     (2006.01)
    *H01L 51/50*     (2006.01)

(56) References Cited

U.S. PATENT DOCUMENTS

| | | | |
|---|---|---|---|
| 2003/0091862 A1* | 5/2003 | Tokito et al. | 428/690 |
| 2005/0167637 A1* | 8/2005 | Konemann | A61K 8/19 252/401 |
| 2006/0041159 A1 | 2/2006 | Wustefeld et al. | |
| 2006/0182992 A1* | 8/2006 | Nii et al. | C07C 251/24 428/690 |
| 2006/0222887 A1* | 10/2006 | Okada | 428/690 |
| 2010/0171111 A1* | 7/2010 | Takada et al. | 257/40 |

FOREIGN PATENT DOCUMENTS

| | | |
|---|---|---|
| JP | 2009-167162 A | 7/2009 |
| WO | WO-2006/06118 A1 | 6/2006 |

OTHER PUBLICATIONS

Delis et al., "Insertions of Allenes into Palladium-Carbon Bonds of Complexes Containing Bidentate Nitrogen Ligands Structural and Mechanistic Studies", Organometallics, vol. 16, No. 4, pp. 551-562 (1997).

Sumby, "Ruthenium(π) Complexes of New Chelating indolizino [2,3-b]pyrazine- and Indolizino[2,3-b]quinoxaline-Derived Ligands: Syntheses, Electrochemistry and Absorption Spectroscopy", Aust. J. Chem., vol. 61, No. 11, pp. 894-904 (2008).

Singh et al., "1,5-Naphthyridine As a New Linker for the Construction of Bridging Ligands and Their Corresponding Ru(II) Complexes", Inorg. Chem., vol. 48, pp. 6459-6470 (2009).

Japanese Office Action mailed on Dec. 9, 2014 for Japanese Application No. 2013-500353.

Hu, Yi-Zhen, et al., "A Luminescent Pt(II) Complex with a Terpyridine-Like Ligand Involving a Six-Membered Chelate Ring", J. of Chem. Soc., (2005), pp. 354-358.

Delis, Johannes G.P., et al., Coordination Modes of the Novel Bifunctional Nitrogen Ligands 8-(2-Pyridyl)Quinoline and 8-(6-Methyl-2-Pyridyl) Quinoline Towards Palladium and Platinum. X-Ray Crystal Structures of 8-(2-Pyridyl)Quinoline)Pd(Me)Ci, 8-(2-Pyridyl)Quinoline)-Pd(C(O)Me)CI and 8-(2-Pyridyl)Quinoline)Pd(PEt3)CI2, Inorganica Chemica Acta, vol. 250, (1996), pp. 87-103.

Abrahamsson, Maria, et al., "A 3.0 μs Room Temperature Excited State Lifetime of a Bistridentate Ru'-Polypyridine Complex for Rod-Like Molecular Arrays", J. Am. Chem. Soc., vol. 128, (2006), pp. 12616-12617.

Abrahamsson, Maria, et al., "Bistridentate Ruthenium(II)Polypyridyl-Type Complexes with Microsecond 3MLCT State Lifetimes: Sensitizers for Rod-Like Molecular Arrays", J. Am. Chem. Soc., vol. 130, (2008), pp. 15533-15542.

International Search Report for PCT/EP2011/000766 mailed Jun. 16, 2011.

\* cited by examiner

MATERIALS FOR ORGANIC ELECTROLUMINESCENT DEVICES

CROSS-REFERENCE TO RELATED APPLICATIONS

This application is a national stage application (under 35 U.S.C. §371) of PCT/EP2011/000766, filed Feb. 17, 2011, which claims benefit of U.S. Provisional Application No. 61/316,619, filed Mar. 23, 2010.

The present invention pertains to metal complexes for organic electroluminescent devices and to organic electroluminescent devices comprising metal complexes.

The structure of organic electroluminescent devices (OLEDs) in which organic semiconductors are employed as functional materials is described, for example, in U.S. Pat. No. 4,539,507, U.S. Pat. No. 5,151,629, EP 0676461 and WO 98/27136. The emitting materials employed here are increasingly organometallic complexes which exhibit phosphorescence instead of fluorescence (M. A. Baldo et al., *Appl. Phys. Lett.* 1999, 75, 4-6). For quantum-mechanical reasons, an up to four-fold increase in energy and power efficiency is possible using organometallic compounds as phosphorescence emitters. In general, however, there is still a need for improvement in OLEDs which exhibit triplet emission, in particular with respect to the stability of the metal complexes, the efficiency, operating voltage and lifetime. Further improvements are therefore desirable here. There is also still a need for improvement in the case of other compounds used in organic electroluminescent devices, such as, for example, matrix materials and charge-transport materials.

In accordance with the prior art, the triplet emitters employed in phosphorescent OLEDs are usually iridium complexes. An improvement in these OLEDs has been achieved by employing metal complexes having polypodal ligands or cryptates, as a consequence of which the complexes have higher thermal stability, which results in a longer lifetime of the OLEDs (WO 04/081017, WO 05/113563, WO 06/008069). However, further improvements in the complexes are still desirable in order to be able to employ these in high-quality and long-lived electroluminescent devices, for example for televisions or computer monitors.

Metal complexes are also employed in other functions in organic electroluminescent devices, for example Alq$_3$ (aluminium tris(hydroxyquinolinate)) as electron-transport material or BAlq (for example T. Tsuji et al., *Journal of the Society of Information Display* 2005, 13(2), 117-122) as triplet matrix material or as hole-blocking material. Further improvements are also still necessary in the case of these materials for use thereof in high-quality electroluminescent devices.

However, OLEDs which display triplet emission still suffer from problems which are in need of improvement. This applies particularly to the triplet emitter itself. Red emitters based on metal complexes which comprise 1-phenylisoquinoline ligands coordinated to iridium as substructures of the formula A and the formula B are known from the literature (e.g. US 2003/0068526, WO 2003/000661). The substructures shown here differ in the absence (formula A) or presence (formula B) of a bridge between the phenyl ring and the isoquinoline ring. This bridge comprises 2-20 alkyl carbon atoms which may be replaced by heteroatoms.

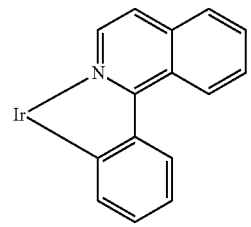

Formula A

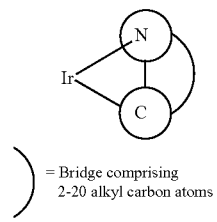

Formula B

) = Bridge comprising 2-20 alkyl carbon atoms

Compounds of this type are suitable as red emitters, but in practice have some critical weak points which make the industrial use of these compounds seem improbable:

1. A critical deficiency is the low thermal stability of the above-described compounds. Thus, for example, the homoleptic complex fac-tris(1-phenylisoquinoline-C$^2$,N) iridium(III) (generally referred to as Ir(piq)$_3$) cannot be sublimed without decomposition. Even under typical high-vacuum conditions (p<10$^{-7}$ mbar), considerable decomposition of this compound is observed, with not only an iridium-containing ash which accounts for about 30% by weight of the amount of Ir(piq)$_3$ used but also the liberation of 1-phenylisoquinoline and other low molecular weight compounds being observed. This thermal decomposition leads to device characteristics having poor reproducibility, with the operational lifetime being particularly adversely affected. In the purification of the metal complexes by sublimation, too, it would be desirable to have thermally more stable complexes available, since the decomposition leads to large losses of complexes.
2. The operating lifetime is generally still low, which stands in the way of introduction of phosphorescent OLEDs in high-quality and long-life devices.
3. The complexes frequently have only a low solubility in organic solvents, which makes efficient purification by recrystallization or chromatography much more difficult or impossible. This applies particularly to the purification of relatively large amounts as are required in manufacture of displays.
4. The complexes are oxidation-sensitive, especially in solution. The purification, storage, transport and processing of these compounds may have to be carried out under inert gas, which is industrially very costly and therefore represents a significant disadvantage.

In particular, a simultaneous improvement in the lifetime and the thermal stability of the complexes would be advantageous. There is therefore a need for compounds which do not suffer from the abovementioned weak points, but are at least equal to the known metal complexes in terms of efficiency and emission colour.

Complexes having improved thermal stability are described in WO 04/081017. However, the synthesis of the ligands of these complexes is complicated, so that complexes with more readily accessible ligands and also good electronic properties and high thermal stability would be advantageous.

The object of the present invention is therefore to provide novel metal complexes for use in organic electroluminescent devices. The metal complexes can be employed here, in particular depending on the metal used, as emitters, as matrix materials, as hole-blocking materials, as electron-transport materials or also in other functions in the OLED. There is still a particular need for improvement in the case of red-, green- and blue-phosphorescent metal complexes.

It has now surprisingly been found that particular new compounds which use a six-membered chelate ring in place of the five-membered chelate ring which is generally used and is used in the compounds depicted below have excellent properties as triplet emitters in OLEDs.

Some metal complexes having six-membered and seven-membered chelate rings for use in OLEDs have been described in the literature.

EP 1211257 describes metal complexes which have a nonconjugated unit X, for example O, S, $CR_2$, etc., between a phenyl ring and a pyridine ring, which results in formation of chelate complexes having six-membered rings and non-continuously conjugated ligand systems. These complexes display blue to orange-red emission, as shown by the examples of the abovementioned patent application, but are obviously not suitable for generating deep-red emission, which may be due to the lack of conjugation of the ligand. However, there is at present still a serious lack of compounds having a deep-red emission and good electronic properties and high thermal stability. In addition, a very high operating voltage is required for light-emitting diodes comprising compounds as described in the patent application cited. Thus, for example, a voltage of from 8 to 12 V is reported for blue emission. This is unsuitable for the application and could once again be due to the lack of conjugation of the ligands. It is therefore not possible to see how such six-membered chelate structures could be beneficially used.

JP 2003/342284 describes similar complexes having a six-membered chelate ring in which the unit X is part of a larger ring system. In particular, X is the nitrogen of a carbazole system or a carbon in the 9 position of a fluorene. This once again results in formation of systems whose ligands are nonconjugated. For this reason, the same disadvantages described above can be expected here.

JP 2004/111193 describes conjugated and nonconjugated complexes having seven-membered chelate rings.

WO 2004/108857 A1 discloses organic electroluminescent devices comprising metal complexes having a tridentate- or higher polydentatechain structure ligand.

WO 2006/061182 A1 discloses metal complexes having a six-membered chelate ring wherein the coordinating atoms of the ligand are carbon and nitrogen.

In addition, it was surprisingly found that certain metal chelate complexes described in detail below result in significant improvements in the organic electroluminescent device, in particular with respect to the lifetime, the efficiency and the stability to heating. This applies, in particular, to green- and blue-phosphorescent electroluminescent devices. The present invention therefore relates to particularly suitable metal complexes which can be used in organic electroluminescent devices. The present invention furthermore relates to organic electroluminescent devices which comprise these complexes.

The present invention provides compounds of the formula (1)

$$M(L)_n(L')_m(L'')_o$$ Formula (1)

containing a substructure $M(L)_n$ of the formula (2),

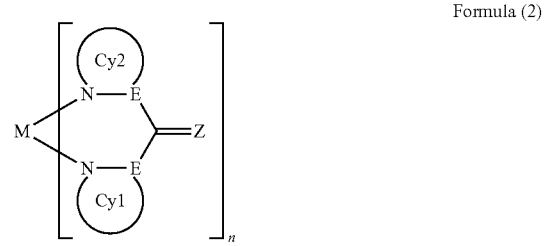

Formula (2)

wherein the symbols and indices used have the following meanings:

M is a transition metal;

E is identical or different on each occurrence and is in each case an $sp^2$-hybridized carbon or nitrogen atom;

Z is identical or different on each occurrence and is in each case $C(R)_2$ or NR;

Cy1, Cy2 is identical or different on each occurrence and is in each case a substituted or unsubstituted heterocycle, which coordinates to M via the N atom and may have a bond to the group Z;

R is identical or different on each occurrence and is in each case H, D, F, CN, a straight-chain alkyl or alkoxy group having from 1 to 40 carbon atoms or a branched or cyclic alkyl or alkoxy group having from 3 to 40 carbon atoms or an alkenyl or alkinyl group having from 2 to 40 carbon atoms, where in each case one or more non-adjacent $CH_2$ groups may be replaced by —$R^2C$=$CR^2$—, —C≡C—, $Si(R^2)_2$, $Ge(R^2)_2$, $Sn(R^2)_2$, —O—, —S—, —$NR^2$—, —(C=O)—, —(C=$NR^2$)—, —P=O($R^2$)—, SO, $SO_2$ or —$CONR^2$— and one or more H atoms may be replaced by F, or an aromatic or heteroaromatic ring system having from 5 to 60 aromatic ring atoms or an aryloxy or a heteroaryloxy group having from 5 to 60 aromatic ring atoms which in each case may be substituted by one or more nonaromatic radicals $R^2$, or a combination of two, three or four of these systems; wherein R may form together with one or both of the rings Cy1 and/or Cy2 a further aliphatic, aromatic or heteroaromatic ring system;

$R^2$ is identical or different on each occurrence selected from the group consisting of an aliphatic hydrocarbon having from 1 to 20 C atoms, an aromatic or heteroaromatic ring system having from 5 to 30 aromatic ring atoms, in which one or more H atoms may be replaced by F, Cl, Br, I, CN or $NO_2$, wherein two or more adjacent substituents $R^2$ form together with the atoms to which they are bonded a mono- or polycyclic aliphatic, aromatic or heteroaromatic ring system;

n is 1, 2 or 3;

wherein the ligands L' and L" in the formula (1) are identical or different and are selected from monodentate, bidentate or tridentate chelating ligands, which can also bind to the ligand L;

m, o are identical or different on each occurrence and are in each case 0, 1 or 2; and n+m+o=2 or 3;

with the proviso that when n=1 and L is a tetradentate ligand then formula (2) has no or only one M-C bond or formula (2) has a tetradentate cyclic ligand;

and furthermore with the proviso that compounds of the following formula are excluded from the invention:

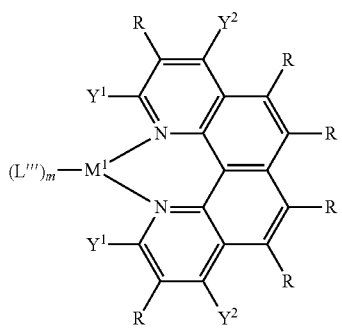

where R and m have the same meanings as specified above and furthermore:

$M^1$ is a transition metal;

$Y^1$ is identical or different on each occurrence H, halogen, a carboxyl, carboxylate, alkyl or functionalized alkyl group, OH or amino group;

$Y^2$ is identical or different on each occurrence H, halogen, an alkoxy, OH, nitro or amino group;

L''' is a ligand.

The indices n, m and o are selected so that the coordination number at the metal M corresponds overall, depending on the metal, to the usual coordination number for this metal. For transition metals, this is usually, depending on the metal, the coordination number 4, 5 or 6, i.e. the indices n, m and o are usually 1, 2 or 3 for transition metals if these coordination sites are not saturated by further donor groups bonded to the ligands L. It is generally known that metal coordination compounds have different coordination numbers, i.e. bond a different number of ligands, depending on the metal and on the oxidation state of the metal. Since the general expert knowledge of the person skilled in the art in the area of organometallic chemistry or coordination chemistry includes the preferred coordination numbers of metals and metal ions in different oxidation states, it will be easy for the person skilled in the art to use a suitable number of further ligands and thus to select the indices n, m and o in a suitable manner depending on the metal and its oxidation state and depending on the precise structure of the ligand of the formula (2). In addition, the metal complex according to the invention and/or the substructure $M-L_n$ may be charged or uncharged, depending on the oxidation state of the metal used. If the complex is charged, it furthermore contains a corresponding counterion.

For the purposes of this invention, an aryl group contains 6 to 60 C atoms; for the purposes of this invention, a heteroaryl group contains 1 to 59 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, etc. For the purposes of this invention, a cyclic carbene is a cyclic group which bonds to the metal via a neutral C atom. The cyclic group here may be saturated or unsaturated. Preference is given here to Arduengo carbenes, i.e. carbenes in which two nitrogen atoms are bonded to the carbene C atom. A five-membered Arduengo carbene ring or another unsaturated five-membered carbene ring is likewise regarded as an aryl group for the purposes of this invention. For the purposes of this invention, an aromatic ring system contains 6 to 60 C atoms in the ring system. For the purposes of this invention, a heteroaromatic ring system contains 1 to 59 C atoms and at least one heteroatom in the ring system, with the proviso that the sum of C atoms and heteroatoms is at least 5. The heteroatoms are preferably selected from N, O and/or S. For the purposes of this invention, an aromatic or heteroaromatic ring system is intended to be taken to mean a system which does not necessarily contain only aryl or heteroaryl groups, but instead in which, in addition, a plurality of aryl or heteroaryl groups may be linked by a nonaromatic unit (preferably less than 10% of the atoms other than H), such as, for example a C, N or O atom. Thus, for example, systems such as 9,9'-spirobifluorene, 9,9-diarylfluorene, triarylamine, diaryl ether, stilbene, etc., are also intended to be taken to mean aromatic ring systems for the purposes of this invention, and likewise systems in which two or more aryl groups are interrupted, for example, by a linear or cyclic alkyl group or by a silyl group.

For the purposes of the present invention, a $C_1$- to $C_{40}$-alkyl group, in which, in addition, individual H atoms or $CH_2$ groups may be substituted by the above-mentioned groups, is preferably taken to mean the radicals methyl, ethyl, n-propyl, i-propyl, n-butyl, i-butyl, s-butyl, t-butyl, 2-methylbutyl, n-pentyl, s-pentyl, tert-pentyl, 2-pentyl, cyclopentyl, n-hexyl, s-hexyl, tert-hexyl, 2-hexyl, 3-hexyl, cyclohexyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, trifluoromethyl, pentafluoroethyl or 2,2,2-trifluoroethyl. An alkenyl group is taken to mean, for example, ethenyl, propenyl, butenyl, pentenyl, cyclopentenyl, hexenyl, cyclohexenyl, heptenyl, cycloheptenyl, octenyl or cyclooctenyl. An alkynyl group is taken to mean, for example, ethynyl, propynyl, butynyl, pentynyl, hexynyl, heptynyl or octynyl. A $C_1$- to $C_{40}$-alkoxy group is preferably taken to mean methoxy, trifluoromethoxy, ethoxy, n-propoxy, i-propoxy, n-butoxy, i-butoxy, s-butoxy, t-butoxy or 2-methylbutoxy. An aromatic or heteroaromatic ring system having 5-60 aromatic ring atoms, which may also in each case be substituted by the radicals R mentioned above and may be linked to the aromatic or heteroaromatic group via any desired positions, is taken to mean, in particular, groups derived from benzene, naphthalene, anthracene, phenanthrene, benzanthracene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydro-pyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

For the purposes of the present invention, a cyclic alkyl, alkoxy or thioalkoxygroup in which, in addition, individual H atoms or $CH_2$ groups may be substituted by the above-mentioned groups, is preferably taken to mean the radicals cyclobutyl, cyclopentyl, cyclohexyl, cycloheptyl, cyclooctyl, tetrahydrofuran, pentamethylene oxide, hexamethylene oxide, tetramethylene sulphide, pentamethylene sulphide etc. A polycyclic alkyl, alkoxy or thioalkoxy group means that two or more of the above cyclic groups are connected via one or more bonds or two or more of the above groups form together a condensed ring system. Also encompassed are bicyclic, tricyclic or polycyclic groups such as bicyclo[2.1.1]hexane, bicyclo[2.2.1]heptane, bicyclo[2.2.2]octane, adamantane (tricyclo[3.3.1.1]decane) and the like.

Cy1 and Cy2, are preferably heteroaromatic groups. Furthermore, further cyclic, aliphatic, aromatic or heteroaromatic rings can also be fused onto Cy1 and Cy2 and/or Cy1 and/or Cy2 can, of course, also be substituted. Here, preferred substituents are the radicals $R^1$ described below.

In a further embodiment it is preferred that the partial structure of formula (2) is represented by formula (3),

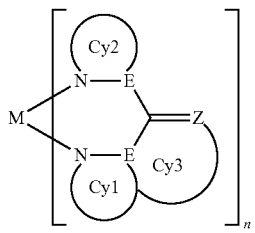

Formula (3)

wherein the symbols and indices have the same meaning as defined above. The substituent Z in formula (3) or (4) is part of the cycle Cy3 and forms an aliphatic, aromatic or heteroaromatic ring system together with Cy1 or Cy2.

According to the invention it is also preferred that the partial structure of formula (2) is represented by formula (4),

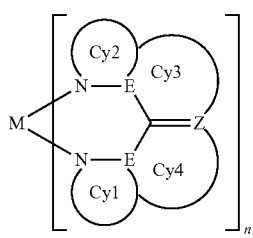

Formula (4)

wherein the symbols and indices have the same meaning as defined above. In this embodiment Z is part of two cycles Cy3 and Cy4 and forms an aliphatic, aromatic or heteroaromatic ring systems together with Cy1 and Cy2.

The binding order of the group C=Z is preferably of from >1 to 2, more preferably from 1.5 to 2. A binding order of 2 means a real double bond, whereas a binding order of 1.5 indicates a conjugated aromatic or heteroaromatic system.

In another embodiment of the invention it is preferred that the partial structure of formula (2) is represented by formula (5) or (6),

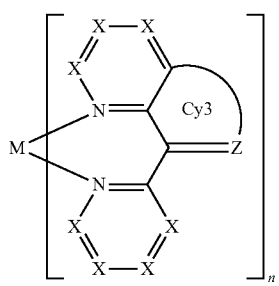

Formula (5)

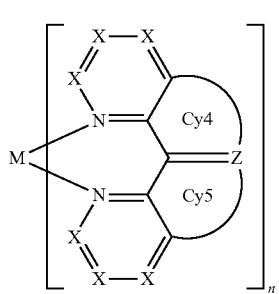

Formula (6)

wherein the symbols and indices have the same meaning as defined above and:
X is identical or different on each occurrence $C(R^1)$ or N provided that at maximum 2 adjacent X are represented by N;
$R^1$ is identical or different on each occurrence selected from the group consisting of H, D, F, Cl, Br, I, CN, $NO_2$, CNO, NCS, SCN, $CF_3$, a straight-chain alkyl, alkoxy or thioalkoxy group having from 1 to 40 carbon atoms or a branched, cyclic or polycyclic alkyl, alkoxy or thioalkoxy group having from 3 to 40 carbon atoms or an alkenyl or alkinyl group having from 2 to 40 carbon atoms, each of which may may be replaced by one or more groups $R^2$, wherein in each case one or more nonadjacent $CH_2$ groups may be replaced by —$R^2C$=$CR^2$—, —C≡C—, $Si(R^2)_2$, $Ge(R^2)_2$, $Sn(R^2)_2$, C=O, C=S, C=Se, C=$NR^2$, P(=O)($R^2$), SO, $SO_2$, $NR^2$, O, S or $CONR^2$ and wherein one or more H atoms may be replaced by F, Cl, Br, I, CN or $NO_2$, or an aromatic or heteroaromatic ring system having from 5 to 60 aromatic ring atoms which may be substituted by one or more radicals $R^2$, or a aryloxy or heteroaryloxy group having from 5 to 60 aromatic ring atoms which may be substituted with one or more radicals $R^2$, or a combination of said systems, wherein two or more adjacent substituents $R^1$ may form together with the atoms to which they are bonded a monocyclic or heterocyclic aliphatic, aromatic or heteroaromatic ring system which ring system may be substituted with one or more radicals $R^2$;
$R^2$ is identical or different on each occurrence selected from the group consisting of an aliphatic hydrocarbon having from 1 to 20 C atoms, an aromatic or heteroaromatic ring system having from 5 to 30 aromatic ring atoms, in which one or more H atoms may be replaced by F, Cl, Br, I, CN or $NO_2$, wherein two or more adjacent substituents $R^2$ form together with the atoms to which they are bonded a mono- or polycyclic aliphatic, aromatic or heteroaromatic ring system;

Cy3, Cy4, Cy5 are identical or different on each occurrence selected such that they form an aliphatic, aromatic or heteroaromatic ring system.

In a further embodiment it is preferred that the partial structure of formula (2) is represented by formula (7) or (8),

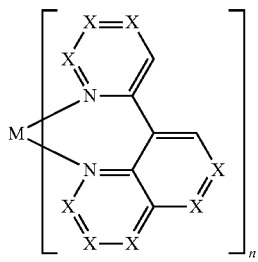

Formula (7)

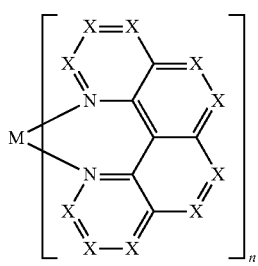

Formula (8)

wherein the symbols and indices have the same meaning as defined above.

Further partial structures $M(L)_n$ according to the invention are the partial structures of formula (9) or (10),

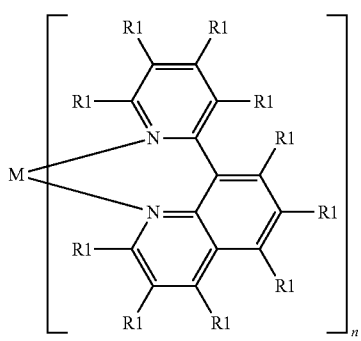

Formula (9)

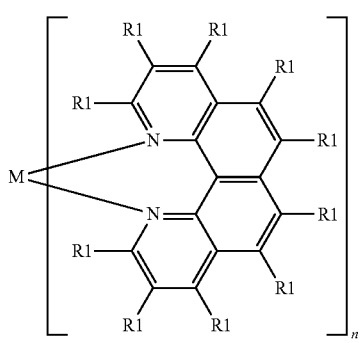

Formula (10)

wherein the symbols and indices have the same meaning as defined above.

The metal M is preferably selected from the group consisting of Zr, Hf, Mo, W, Ru, Os, Rh, Ir, Ni, Pd, Pt, Cu, Ag and Au, in particular preferred Ir, Pt and Cu.

According to the invention $R^1$ is more preferred identical or different on each occurrence selected from the group consisting of H, D, F, Br, I, CN, a straight chain alkyl, alkoxy or thioalkoxy group having from 1 to 6 C-atoms or a branched or cyclic alkyl, alkoxy or thioalkoxy group having from 3 to 6 C atoms, which may be substituted with one or more radicals $R^2$, wherein one or more non-adjacent $CH_2$ groups may be replaced by $R^2C=CR^2$, C=O, $NR^2$, O or S and wherein one or more H-atoms may be replaced by F, Br, I or Cn, an aromatic or heteroaromatic ring system having from 5 to 20 aromatic ring atoms which may be substituted with one or more radicals $R^2$, an aryloxy or heteroaryloxy group having from 5 to 20 aromatic ring atoms, which may be substituted with one or more radicals $R^2$, and a combination of that systems, wherein two or more adjacent substituents $R^1$ form a monocyclic or polycyclic aliphatic, aromatic or heteroaromatic ring system which may be substituted with one or more radicals $R^2$ and wherein the radicals $R^1$ at the C-atoms in ortho position to the coordinating N-atoms may form together with M a ring.

Most preferred $R^1$ is selected from the group consisting of methyl, ethyl, i-propyl, t-butyl, phenyl, o-/m-/p-biphenyl, o-/m-/p- or branched terphenyl, 1-/2-naphthyl, 2-/3-/4-pyridyl and diacine, wherein the diacine is preferably selected from the group consisting of pyrazine, pyridazine or pyrimidine or their derivatives.

In a particularly preferred embodiment the ligand $L_n$ in the partial structure $M(L)_n$ is a tridentate or tetradentate ligand, which is demonstrated in formula (11) or (12),

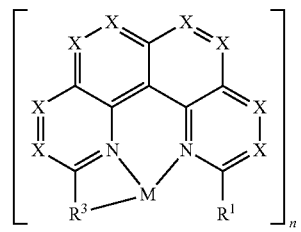

Formula (11)

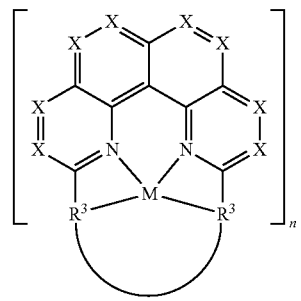

Formula (12)

wherein the symbols and indices have the same meaning as defined above, $R^3$ is a group coordinated to M and is selected such that a 5-, 6-, or 7-ring chelate is formed wherein $R^3$ comprises a donor group selected from C, N, P, O or S or a combination thereof;

the half cycle in formula (12) represents a group necessary to form an aliphatic, aromatic or heteroaromatic ring system, but is not necessarily present.

Further partial structures according to formula (11) or (12) are represented by formula (13) or (14),

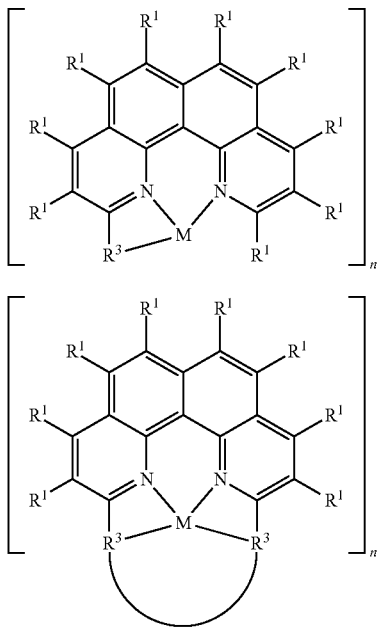

Formula (13)

Formula (14)

wherein the symbols and indices habe the same meaning as defined above. $R^3$ preferably bonds via the donor groups C, N, P, O or S or a combination thereof to the metal M.

Preferred carbon-containing donor groups $R^3$ are acetylides and aliphatic or aromatic isonitriles.

Preferred nitrogen-containing donor groups $R^3$ are aromatic nitrogen containing heterocycles, aliphatic amines, preferably containing $C_1$-$C_{20}$-alkyl groups, particularly preferably containing $C_1$-$C_{10}$-alkyl groups, very particularly preferably containing $C_1$-$C_4$-alkyl groups, aliphatic cyclic amines, for example pyrrolidine, piperidine or morpholine, nitriles, amides, imides and imines, each of which may be substituted by groups R or unsubstituted.

Preferred phosphorus-containing donor groups $R^3$ are $PF_2$, $P(NR^4{}_2)_2$, where $R^4$ stands, identically or differently on each occurrence, for a $C_1$-$C_{20}$-alkyl group or an aryl or heteroaryl group in the sense of the definition given above, alkyl-, aryl- or mixed alkylarylphosphines, alkylhalo-, arylhalo- or mixed alkylarylhalophosphines, where the halogen may in each case be F, Cl, Br or I, alkyl, aryl or mixed alkyl aryl phosphites or phosphaaromatic compounds, such as, for example, phosphabenzene, each of which may be substituted by groups R or unsubstituted. The alkyl groups here are preferably $C_1$-$C_{20}$-alkyl groups, particularly preferably $C_1$-$C_{10}$-alkyl groups, very particularly preferably $C_1$-$C_4$-alkyl groups. An aryl group is also taken to mean heteroaryl groups. These groups are as defined above.

Preferred oxygen-containing donor groups $R^3$ are phenols, alcohols, alcoholates, open-chain or cyclic, aliphatic or aromatic ethers, oxygen heterocycles, such as, for example, furan, aldehydes, ketones, phosphine oxide groups, phosphates, phosphonates, borates, silicates, sulfoxide groups, carboxylates, phenols, phenolates, oximes, hydroxamates, β-keto-ketonates, β-keto esters and β-diesters, each of which may be substituted by groups R or unsubstituted, where the last-mentioned groups represent bidentate-chelating ligands. The alkyl groups in these groups are preferably $C_1$-$C_{20}$-alkyl groups, particularly preferably $C_1$-$C_{10}$-alkyl groups, very particularly preferably $C_1$-$C_4$-alkyl groups. An aryl group is also taken to mean heteroaryl groups. These groups are as defined above.

Preferred sulfur-containing donor groups $R^3$ are sulfur heteroaromatic groups, aliphatic or aromatic thiols and thiolates, open-chain or cyclic thioethers, thiocarbonyl groups, phosphine sulfides and thiocarboxylates, each of which may be substituted by groups R or unsubstituted. The alkyl groups in these groups are preferably $C_1$-$C_{20}$-alkyl groups, particularly preferably $C_1$-$C_{10}$-alkyl groups, very particularly preferably $C_1$-$C_4$-alkyl groups. An aryl group is also taken to mean heteroaryl groups. These groups are as defined above.

Bidentate-chelating groups $R^3$ can also be formed from these donor groups by combining two of these groups, which may be identical or different and may have identical or different donor atoms. These groups may also be substituted by one or more radicals R. Examples of bidentate-chelating groups of this type are substituted or unsubstituted β-keto-ketonates, β-keto esters, β-diesters, carboxylates derived from aminocarboxylic acids, such as, for example, pyridine-2-carboxylic acid, quinoline-2-carboxylic acid, glycine, dimethylglycine, alanine or dimethylaminoalanine, iminoacetoacetonates, hydroxamates, pyridylphosphines, α-phosphinocarboxylates, glycol ethers, ether alcoholates, dialcoholates derived from dialcohols, such as, for example, ethylene glycol or 1,3-propylene glycol, dithiolates derived from dithiols, such as, for example, 1,2-ethylenedithiol or 1,3-propylenedithiol, diamines, such as, for example, ethylenediamine, propylenediamine or cis- or trans-diaminocyclohexane, imines, such as, for example, 2-[1-(phenylimino)ethyl]pyridine, 2-[1-(2-methylphenylimino)ethyl]pyridine, 2-[1-(2,6-di-iso-propylphenylimino)ethyl]pyridine, 2-[1-(methylimino)ethyl]pyridine, 2-[1-(ethylimino)-ethyl]pyridine, 2-[1-(iso-propylimino)ethyl]pyridine or 2-[1-(tert-butylimino)-ethyl]pyridine, diimines, such as, for example, 1,2-bis(methylimino)ethane, 1,2-bis(ethylimino)ethane, 1,2-bis(iso-propylimino)ethane, 1,2-bis(tert-butylimino)ethane, 2,3-bis(methylimino)butane, 2,3-bis(ethylimino)butane, 2,3-bis(iso-propylimino)butane, 2,3-bis(tert-butylimino)butane, 1,2-bis-(phenylimino)ethane, 1,2-bis(2-methylphenylimino)ethane, 1,2-bis(2,6-di-iso-propylphenylimino)ethane, 1,2-bis(2,6-di-tert-butylphenylimino)ethane, 2,3-bis (phenylimino)butane, 2,3-bis(2-methylphenylimino)butane, 2,3-bis-(2,6-di-iso-propylphenylimino)butane or 2,3-bis(2, 6-di-tert-butylphenyl-imino)butane, diphosphines, such as, for example, bis(diphenylphosphinomethane, bis(diphenylphosphino)ethane, bis(diphenylphosphino)propane, bis(dimethylphosphino)methane, bis(dimethylphosphino)ethane, bis-(dimethylphosphino)propane, bis(diethylphosphino) methane, bis(diethylphosphino)ethane, bis(diethylphosphino)propane, bis(di-tert-butylphosphino)methane, bis(di-tert-butylphosphino)ethane, bis(tert-butylphosphino)propane, salicyliminates derived from salicylimines, such as, for example, methylsalicylimine, ethylsalicylimine or phenylsalicylimine, etc.

The ligands L may be neutral, positive or negative charged. Preferred are neutral complexes.

The ligands L' and L" in the compound of formula (1) are preferably neutral, monoanionic, dianionic or trianionic ligands, particularly preferably neutral or monoanionic ligands. They are preferably monodentate, bidentate or tridentate, i.e. have one, two or three coordination sites. Preferred neutral, monodentate ligands are selected from carbon monoxide, NO, isonitriles, such as, for example, tert-butyl isonitrile, cyclohexyl isonitrile, adamantyl isonitrile, phenyl isonitrile, mesityl isonitrile, 2,6-dimethylphenyl isonitrile, 2,6-di-iso-propylphenyl isonitrile, 2,6-di-tert-butylphenyl isonitrile, amines, such as, for example, trimethylamine, triethylamine, morpholine, phosphines, such as, for example, trifluorophosphine, trimethylphosphine, tricyclohexylphosphine, tri-tert-butyl-phosphine, triphenylphosphine, tris(pentafluorophenyl)phosphine, phosphites, such as, for example, trimethyl phosphite, triethyl phosphite, arsines, such as, for example, trifluoroarsine, trimethylarsine, tricyclohexylarsine, tri-tert-butylarsine, triphenylarsinine, tris(pentafluorophenyl)-arsine, stibines, such as, for example, trifluorostibine, trimethylstibine, tricyclohexylstibine, tri-tert-butylstibine, triphenylstibine, tris(pentafluorophenyl)stibine, and nitrogen-containing heterocyclic compounds, such as, for example, pyridine, pyridazine, pyrazine, pyrimidine, triazine.

Preferred monoanionic, monodentate ligands are selected from hydride, deuteride, the halides F, Cl, Br and I, alkylacetylides, such as, for example, methyl-C≡C—, tert-butyl-C≡C—, arylacetylides, such as, for example, phenyl-C≡C$^-$, cyanide, cyanate, isocyanate, thiocyanate, isothiocyanate, aliphatic or aromatic alcoholates, such as, for example, methanolate, ethanolate, propanolate, iso-propanolate, tert-butylate, phenolate, aliphatic or aromatic thioalcoholates, such as, for example, methanethiolate, ethanethiolate, propanethiolate, iso-propanethiolate, tert-thiobutylate, thiophenolate, amides, such as, for example, dimethylamide, diethylamide, di-iso-propylamide, morpholide, carboxylates, such as, for example, acetate, trifluoroacetate, propionate, benzoate, and anionic, nitrogen-containing heterocyclic compounds, such as pyrrolide, imidazolide, pyrazolide. The alkyl groups in these groups are preferably $C_1$-$C_{20}$-alkyl groups, particularly preferably $C_1$-$C_{10}$-alkyl groups, very particularly preferably $C_1$-$C_4$-alkyl groups. An aryl group is also taken to mean heteroaryl groups. These groups are as defined above.

Preferred di- or trianionic ligands are $O^{2-}$, $S^{2-}$, nitrenes, which result in coordination in the form R—N=M, where R generally stands for a substituent, or $N^{3-}$.

Preferred neutral or mono- or dianionic bidentate or polydentate ligands are selected from diamines, such as, for example, ethylenediamine, N,N,N',N'-tetramethylethylenediamine, propylenediamine, N,N,N',N'-tetramethylpropylenediamine, cis- or trans-diaminocyclohexane, cis- or trans-N,N,N',N'-tetramethyldiaminocyclohexane, imines, such as, for example, 2-[1-(phenylimino)ethyl]pyridine, 2-[1-(2-methylphenylimino)ethyl]pyridine, 2-[1-(2,6-di-iso-propylphenylimino)ethyl]pyridine, 2-[1-(methylimino)ethyl]-pyridine, 2-[1-(ethylimino)ethyl]pyridine, 2-[1-(iso-propylimino)ethyl]pyridine, 2-[1-(tert-butylimino)ethyl] pyridine, diimines, such as, for example, 1,2-bis (methylimino)ethane, 1,2-bis(ethylimino)ethane, 1,2-bis (iso-propylimino)ethane, 1,2-bis(tert-butylimino)ethane, 2,3-bis(methylimino)butane, 2,3-bis(ethylimino)butane, 2,3-bis(iso-propylimino)butane, 2,3-bis(tert-butylimino)butane, 1,2-bis(phenylimino)ethane, 1,2-bis(2-methylphenylimino)ethane, 1,2-bis(2,6-di-iso-propylphenylimino)ethane, 1,2-bis(2,6-di-tert-butylphenylimino)ethane, 2,3-bis (phenylimino)butane, 2,3-bis(2-methylphenylimino)butane, 2,3-bis(2,6-di-iso-propylphenylimino)butane, 2,3-bis(2,6-di-tert-butylphenylimino)butane, heterocyclic compounds containing two nitrogen atoms, such as, for example, 2,2'-bipyridine, o-phenanthroline, diphosphines, such as, for example, bis(diphenylphosphino)-methane, bis(diphenylphosphino)ethane, bis(diphenylphosphino)propane, bis(dimethylphosphino)methane, bis(dimethylphosphino)ethane, bis-(dimethylphosphino)propane, bis(diethylphosphino) methane, bis(diethylphosphino)ethane, bis(diethylphosphino)propane, bis(di-tert-butylphosphino)methane, bis(di-tert-butylphosphino)ethane, bis(tert-butylphosphino)-propane, 1,3-diketonates derived from 1,3-diketones, such as, for example, acetylacetone, benzoylacetone, 1,5-diphenylacetylacetone, dibenzoylmethane, bis(1,1,1-trifluoroacetyl)methane, 3-ketonates derived from 3-ketoesters, such as, for example, ethyl acetoacetate, carboxylates derived from aminocarboxylic acids, such as, for example, pyridine-2-carboxylic acid, quinoline-2-carboxylic acid, glycine, N,N-dimethylglycine, alanine, N,N-dimethylaminoalanine, salicyliminates derived from salicylimines, such as, for example, methylsalicylimine, ethylsalicylimine, phenylsalicylimine, dialcoholates derived from dialcohols, such as, for example, ethylene glycol, 1,3-propylene glycol, and dithiolates derived from dithiols, such as, for example, 1,2-ethylenedithiol, 1,3-propylenedithiol.

Preferred tridentate ligands are borates of nitrogen-containing heterocyclic compounds, such as, for example, tetrakis(1-imidazolyl) borate and tetrakis(1-pyrazolyl) borate.

Preference is furthermore given to bidentate monoanionic ligands which, with the metal, form a cyclometallated five-membered ring containing at least one metal-carbon bond. These are, in particular, ligands as are generally used in the area of phosphorescent metal complexes for organic electroluminescent devices, i.e. ligands of the type phenylpyridine, naphthylpyridine, phenylquinoline, phenylisoquinoline, etc., each of which may be substituted by one or more radicals R. A multiplicity of such ligands is known to the person skilled in the art in the area of phosphorescent electroluminescent devices, and he will be able, without inventive step, to select further ligands of this type as ligand L' and L" for compounds of the formula (1).

Likewise preferred ligands L' and L" are $\eta^5$-cyclopentadienyl, $\eta^5$-pentamethylcyclopentadienyl, $\eta^6$-benzene or $\eta^7$-cycloheptatrienyl, each of which may be substituted by one or more radicals R.

The ligands are either conjugated or cross-conjugated systems. Conjugated systems are produced when at least one of the substituents R together with the ring Cy1 and/or Cy2 forms an aromatic or heteroaromatic ring system. On the other hand, cross-conjugated systems are produced when none of the substituents R together with Cy1 or Cy2 forms an aromatic or heteroaromatic ring system, i.e. when R forms either an aliphatic ring system or no ring system at all together with Cy1 or Cy2.

In a particularly preferred embodiment of the invention, the ligand systems are stiff systems, i.e. systems in which the two substituents R together with the ring Cy1 and ring Cy2 form six-membered rings.

In a further preferred embodiment of the invention, two or three ligands L and/or L' and/or L" can be joined via the radicals $R^1$ to form a polypodal system or a cryptand. The link in this case can be either to Cy1 or Cy2.

The corresponding ligands which produce the substructures of the formula (2) and also the ligands L' and L" can be prepared by customary methods of organic chemistry as are known to those skilled in the art of organic synthesis.

The metal complexes of the invention can in principle be prepared by various methods known to those skilled in the art.

These methods enable the inventive compounds of the formula (1) to be obtained in high purity, preferably more than 99% (determined by means of $^1$H-NMR and/or HPLC).

The inventive compounds described above can also be used as comonomers for producing corresponding conjugated, partly conjugated or nonconjugated oligomers, polymers or dendrimers. The polymerization is preferably effected via a bromine functionality. Thus, they can be copolymerized into, inter alia, polyfluorenes (e.g. as described in EP 842208 or WO 00/22026), polyspirobifluorenes (e.g. as described in EP 707020 or EP 894107), poly-para-phenylenes (e.g. as described in WO 92/18552), polydihydrophenanthrenes (e.g. as described in WO 05/014689), polyphenanthrenes (e.g. as described in the unpublished patent application DE 102004020298.2), polyindenofluorenes (e.g. as described in WO 04/041901 and WO 04/113412), polycarbazoles (e.g. as described in WO 04/070772 or WO 04/113468), polyketones (e.g. as described in WO 05/040302), polysilanes (e.g. as described in WO 05/111113) or polythiophenes (e.g. as described in EP 1028136) or into copolymers comprising various units of these types. These units can either be built into the side chain or into the main chain of the polymer or can also represent branching points of the polymer chains (e.g. as described in WO 06/003000) or the end groups of the polymer chain.

The invention therefore also provides for the use of compounds of the formula (1) in which at least one of the substituents $R^1$ is a group which is capable of a C—C coupling reaction catalyzed by palladium or nickel for the synthesis of conjugated, partly conjugated or nonconjugated polymers, oligomers or dendrimers. The substituent which is capable of a C—C coupling reaction is preferably selected from the group consisting of Cl, Br, I, O-tosylate, O-triflate, O—SO$_2$R$^2$, B(OR$^2$)$_2$ and Sn(R$^2$)$_3$, particularly preferably from among Br, O-triflate and B(OR$^2$)$_2$, where $R^2$ is as defined above and two or more radicals $R^2$ may together also form a ring system. Preference is also given to this group being bound to the ring Cy1, particularly preferably in the para position relative to the bond to the metal M. These metal complexes which can be used as monomers for the polymerization are likewise a preferred embodiment of the present invention.

Depending of whether this group which is capable of the C—C coupling reaction is present once, twice or three times or more often in the complex, the complex represents an end group in the polymer or it is incorporated linearly into the polymer chain, or it represents a branching point of the polymer chain. Furthermore, the complex can also, if appropriately substituted, be a side chain or a linear or branched polymer chain.

The invention thus also provides conjugated, partly conjugated or nonconjugated oligomers, polymers or dendrimers comprising one or more of the compound of the formula (1) with at least one of the above-defined radicals R and $R^1$, preferably $R^1$, representing a bond to the oligomer, polymer or dendrimer. The same preferences as described above apply to units of the formula (1) in polymers and dendrimers.

The abovementioned oligomers, polymers, copolymers and dendrimers display good solubility in organic solvents and a high efficiency and stability in organic electroluminescent devices. Furthermore, these oligomers, polymers and dendrimers are very thermally stable. The invention therefore furthermore relates to oligomers, polymers or dendrimers comprising one or more compounds of the formula (1) where one or more bonds are present from the complex of the formula (1) to the polymer, oligomer or dendrimer. Depending on the linking of the compound of the formula (1) the complex therefore forms a side chain of the oligomer or polymer or is linked in the main chain. The polymers, oligomers or dendrimers may be conjugated, partially conjugated or nonconjugated. The oligomers or polymers may be linear, branched or dendritic.

The same preferences as described above apply entirely analogously to the recurring units of the formula (1) in oligomers, dendrimers and polymers.

For the preparation of the oligomers or polymers, the monomers according to the invention are homopolymerised or copolymerised with further monomers. Preference is given to copolymers, where the units of the formula (1) are preferably present in an amount of 0.01 to 50 mol %, particularly preferably in the range from 0.1 to 20 mol %. Suitable and preferred comonomers which form the polymer backbone are selected from fluorenes (for example in accordance with EP 842208 or WO 00/22026), spirobifluorenes (for example in accordance with EP 707020, EP 894107 or WO 06/061181), para-phenylenes (for example in accordance with WO 92/18552), carbazoles (for example in accordance with WO 04/070772 or WO 04/113468), thiophenes (for example in accordance with EP 1028136), dihydrophenanthrenes (for example in accordance with WO 05/014689), cis- and trans-indenofluorenes (for example in accordance with WO 04/041901 or WO 04/113412), ketones (for example in accordance with WO 05/040302), phenanthrenes (for example in accordance with WO 05/104264 or WO 07/017,066) or also a plurality of these units. The proportion of these units in total is preferably in the region of at least 50 mol %. The polymers, oligomers and dendrimers may also comprise further units, for example hole-transport units, in particular those based on triarylamines, and/or electron-transport units.

Furthermore, the metal complexes according to the invention may also be further functionalised and thus converted into extended metal complexes. An example which may be mentioned here is the functionalisation with arylboronic acids by the SUZUKI method or with primary or secondary amines by the HARTWIG-BUCHWALD method.

The inventive compounds, oligomers, polymers, dendrimers or expanded compounds of the formula (1) are used as active components in electronic components such as organic light-emitting devices/diodes (OLEDs), organic integrated circuits (O-ICs), organic field effect transistors (O-FETs), organic thin film transistors (O-TFTs), organic solar cells (O-SCs), organic light-emitting transistors (O-LETs), organic field quench devices (O-FQDs), light-emitting electrochemical cells (LECs) or organic laser diodes (O-lasers), in particular as light-emitting compound, most preferred as triplett emitter in OLEDs.

A further aspect of the present invention provides therefore an electronic component comprising a compound of the formula (1')

$$M(L)_n(L')_m(L'')_o \qquad \text{Formula (1')}$$

containing a substructure M(L)$_n$ of the formula (2),

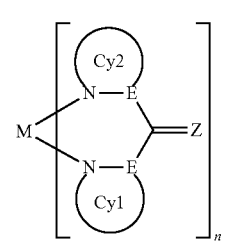

Formula (2)

wherein the symbols and indices used have the following meanings:

M is a transition metal;

E is identical or different on each occurrence and is in each case an $sp^2$-hybridized carbon or nitrogen atom;

Z is identical or different on each occurrence and is in each case $C(R)_2$ or NR;

Cy1, Cy2 is identical or different on each occurrence and is in each case a substituted or unsubstituted heterocycle which coordinates to M via the N atom and may have a bond to the group Z;

R is identical or different on each occurrence and is in each case H, D, F, CN, a straight-chain alkyl or alkoxy group having from 1 to 40 carbon atoms or a branched or cyclic alkyl or alkoxy group having from 3 to 40 carbon atoms or an alkenyl or alkinyl group having from 2 to 40 carbon atoms, where in each case one or more non-adjacent $CH_2$ groups may be replaced by $-R^2C=CR^2-$, $-C\equiv C-$, $Si(R^2)_2$, $Ge(R^2)_2$, $Sn(R^2)_2$, $-O-$, $-S-$, $-NR^2-$, $-(C=O)-$, $-(C=NR^2)-$, $-P=O(R^2)-$, $SO$, $SO_2$ or $-CONR^2-$ and one or more H atoms may be replaced by F, or an aromatic or heteroaromatic ring system having from 5 to 60 aromatic ring atoms or an aryloxy or a heteroaryloxy group having from 5 to 60 aromatic ring atoms which in each case may be substituted by one or more nonaromatic radicals $R^2$, or a combination of two, three or four of these systems; wherein R may form together with one or both of the rings Cy1 and/or Cy2 a further aliphatic, aromatic or heteroaromatic ring system;

$R^2$ is identical or different on each occurrence selected from the group consisting of an aliphatic hydrocarbon having from 1 to 20 C atoms, an aromatic or heteroaromatic ring system having from 5 to 30 aromatic ring atoms, in which one or more H atoms may be replaced by F, Cl, Br, I, CN or $NO_2$, wherein two or more adjacent substituents $R^2$ form together with the atoms to which they are bonded a mono- or polycyclic aliphatic, aromatic or heteroaromatic ring system;

n is 1, 2 or 3;

wherein the ligands L' and L" in the formula (1) are identical or different and are selected from monodentate, bidentate or tridentate chelating ligands, which can also bind to the ligand L;

m, o are identical or different on each occurrence and are in each case 0, 1 or 2; and n+m+o=2 or 3;

with the proviso that when n=1 and L is a tetradentate ligand then formula (2) has no or only one M-C bond or formula (2) is a tetradentate cyclic ligand.

The electronic component is preferably selected from the group consisting of organic light-emitting devices/diodes (OLEDs), organic integrated circuits (O-ICs), organic field effect transistors (O-FETs), organic thin film transistors (O-TFTs), organic solar cells (O-SCs), organic light-emitting transistors (O-LETs), organic field quench devices (O-FQDs), light-emitting electrochemical cells (LECs) or organic laser diodes (O-lasers), in particular organic light-emitting devices.

The organic electroluminescent device (OLED) comprises cathode, anode and at least one emitting layer. Apart from these layers, it may also comprise further layers, for example in each case one or more hole-injection layers, hole-transport layers, hole-blocking layers, electron-transport layers, electron-injection layers, exciton-blocking layers, charge-generation layers and/or organic or inorganic p/n junctions. Interlayers, which have, for example, an exciton-blocking function, may likewise be introduced between two emitting layers. However, it should be pointed out that each of these layers does not necessarily have to be present. The organic electroluminescent device may comprise one emitting layer or it may comprise a plurality of emitting layers, where at least one emitting layer comprises at least one compound of the formula (1). If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems, where the three layers exhibit blue, green and orange or red emission (for the basic structure, see, for example, WO 05/011013).

In a preferred embodiment of the invention, the organic electroluminescent device comprises the compound of the formula (1) or the preferred embodiments indicated above as emitting compound in an emitting layer. This is the case, in particular, if the metal M is Ir or Pt.

If the compound of the formula (1) is employed as emitting compound in an emitting layer, it is preferably employed in combination with one or more matrix materials. The mixture of the compound of the formula (1) and the matrix material comprises between 1 and 99% by volume, preferably between 2 and 90% by volume, particularly preferably between 3 and 40% by volume, in particular between 5 and 15% by volume, of the compound of the formula (1) based on the mixture as a whole comprising emitter and matrix material. Correspondingly, the mixture comprises between 99 and 1% by volume, preferably between 98 and 10% by volume, particularly preferably between 97 and 60% by volume, in particular between 95 and 85% by volume, of the matrix material, based on the mixture as a whole comprising emitter and matrix material.

Suitable matrix materials are ketones, phosphine oxides, sulfoxides and sulfones, for example in accordance with WO 04/013080, WO 04/093207, WO 06/005627 or WO 2010/006680, triarylamines, carbazole derivatives, for example CBP (N,N-biscarbazolylbiphenyl) or the carbazole derivatives disclosed in WO 05/039246, US 2005/0069729, JP 2004/288381, EP 1205527 or WO 08/086,851, indolocarbazole derivatives, for example in accordance with WO 07/063,754 or WO 08/056,746, indenocarbazole derivatives, for example in accordance with WO 10/136,109 or the unpublished application DE 102009031021.5, azacarbazoles, for example in accordance with EP 1617710, EP 1617711, EP 1731584, JP 2005/347160, bipolar matrix materials, for example in accordance with WO 07/137,725, silanes, for example in accordance with WO 05/111172, azaboroles or boronic esters, for example in accordance with WO 06/117052, triazine derivatives, for example in accordance with WO 2010/015306, WO 07/063,754 or WO 08/056,746, or zinc complexes, for example in accordance with EP 652273 or in accordance with WO 09/062,578.

In a further preferred embodiment of the invention, the compound of the formula (1) or the preferred embodiments indicated above is employed as matrix material for an emitting compound in an emitting layer.

If the compound of the formula (1) or the preferred embodiments indicated above is employed as matrix material for an emitting compound in an emitting layer, it is preferably employed in combination with one or more phosphorescent materials (triplet emitters). For the purposes of this invention, phosphorescence is taken to mean the luminescence from an excited state of relatively high spin multiplicity, i.e. a spin state >1, in particular from an excited triplet state or from an MLCT mixed state. For the purposes of the present invention, all luminescent transition-metal complexes, in particular all luminescent iridium, platinum and copper complexes, are intended to be regarded as triplet emitters. The mixture of the compound of the formula (1) or the preferred embodiment indicated above and the emitting compound then comprises between 99 and 1% by volume, preferably between 98 and 10% by volume, particularly preferably between 97 and 60% by volume, in particular between 95 and 85% by volume, of the compound of the formula (1) or the preferred embodiment indicated above, based on the mixture as a whole comprising emitter and matrix material. Correspondingly, the mixture comprises between 1 and 99% by volume, preferably between 2 and 90% by volume, particularly preferably between 3 and 40% by volume, in particular between 5 and 15% by volume, of the emitter, based on the mixture as a whole comprising emitter and matrix material.

Suitable phosphorescent compounds are, in particular, compounds which emit light, preferably in the visible region, on suitable excitation and in addition contain at least one atom having an atomic number greater than 20, preferably greater than 38 and less than 84, particularly preferably greater than 56 and less than 80. The phosphorescence emitters used are preferably compounds which contain copper, molybdenum, tungsten, rhenium, ruthenium, osmium, rhodium, iridium, palladium, platinum, silver, gold or europium, in particular compounds which contain iridium or platinum.

Examples of the emitters described above are revealed by the applications WO 00/70655, WO 01/41512, WO 02/02714, WO 02/15645, EP 1191613, EP 1191612, EP 1191614, WO 05/033244 or WO 09/118,087. Furthermore suitable as emitter are the above-indicated compounds of the formula (1) or the preferred embodiments indicated above. In general, all phosphorescent complexes as are used in accordance with the prior art for phosphorescent OLEDs and as are known to the person skilled in the art in the area of organic electroluminescence are suitable, and the person skilled in the art will be able to use further phosphorescent complexes without inventive step.

In a further preferred embodiment of the invention, the compound of the formula (1) or the preferred embodiments indicated above is employed as hole-blocking material in a hole-blocking layer and/or as electron-transport material in an electron-transport layer. The emitting layer here may be fluorescent or phosphorescent.

In a further preferred embodiment of the invention, the compound of the formula (1) or the preferred embodiments indicated above is employed as hole-transport material in a hole-transport or a hole injection layer and/or as electron-blocking or exciton-blocking material in an exciton-blocking layer.

Preference is furthermore given to an organic electroluminescent device, characterised in that one or more layers are applied by means of a sublimation method, in which the materials are vapour-deposited in vacuum sublimation units at an initial pressure of less than $10^{-5}$ mbar, preferably less than $10^{-6}$ mbar. It is also possible for the initial pressure to be even lower, for example less than $10^{-7}$ mbar.

Preference is likewise given to an organic electroluminescent device, characterised in that one or more layers are applied by means of the OVPD (organic vapour phase deposition) method or with the aid of carriergas sublimation, in which the materials are applied at a pressure between $10^{-5}$ mbar and 1 bar. A special case of this method is the OVJP (organic vapour jet printing) method, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, offset printing or nozzle printing, but particularly preferably LITI (light induced thermal imaging, thermal transfer printing) or ink-jet printing. Soluble compounds are necessary for this purpose, which are obtained, for example, by suitable substitution.

These methods are known in general terms to the person skilled in the art and can be applied by him without problems to organic electroluminescent devices comprising compounds of the formula (1) or the preferred embodiments indicated above.

The invention encompasses also a formulation, in particular a solution, comprising one or more compounds or oligomers, polymers or dendrimers as defined above and at least one solvent.

Exemplary compounds for the partial structure $M(L)_n$ according to the invention are shown in the table below:

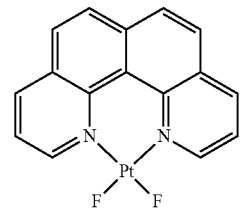

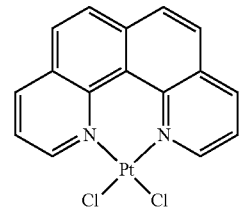

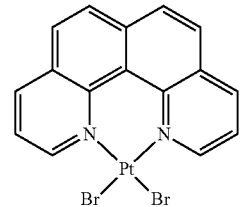

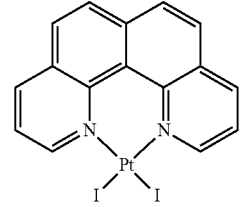

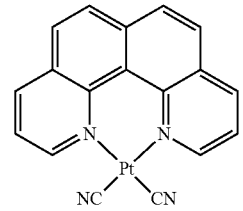

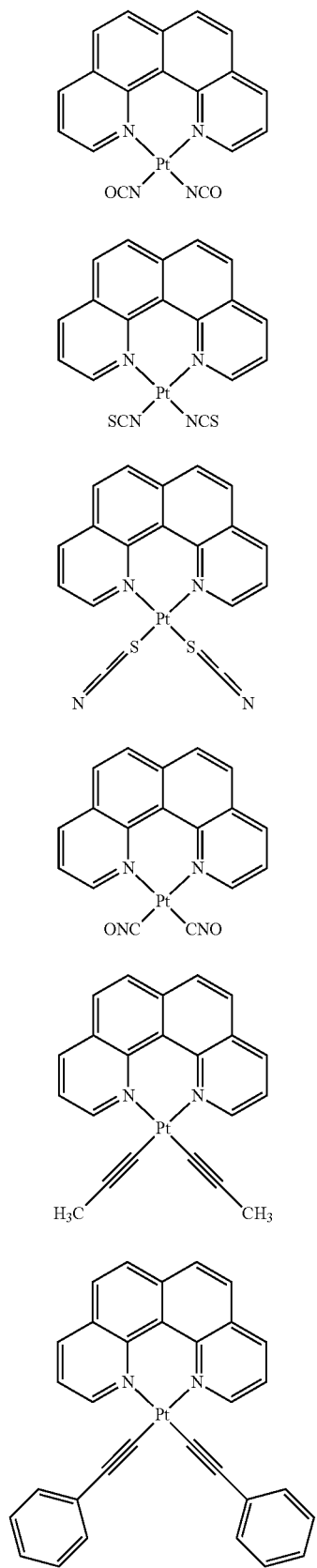
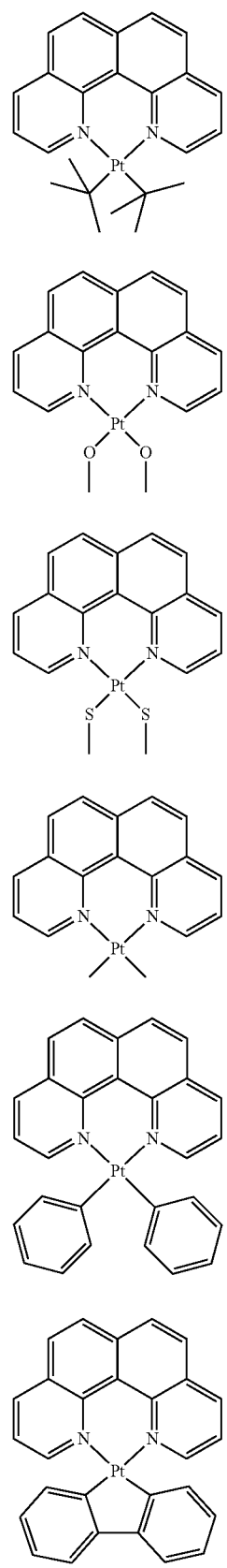

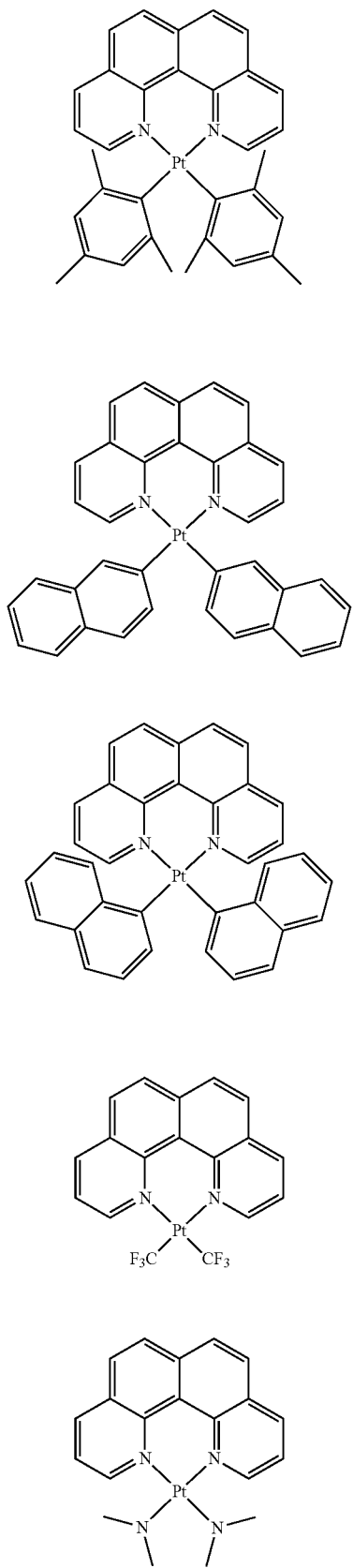
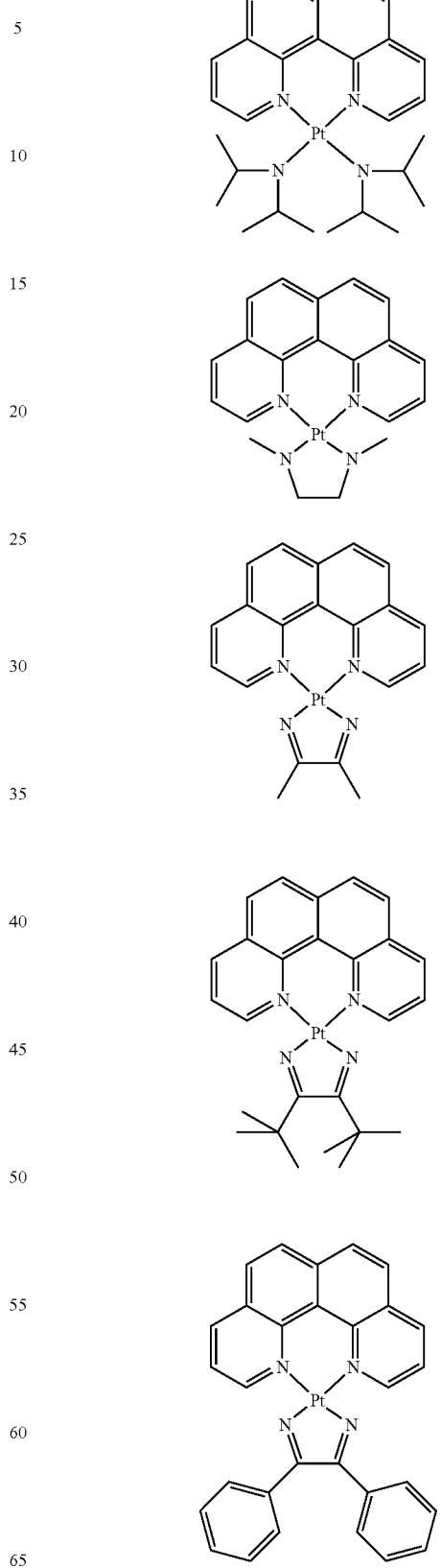

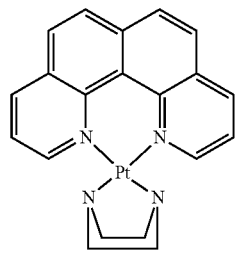
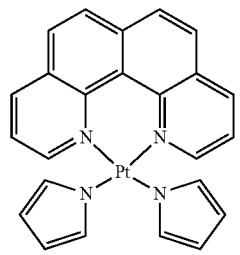
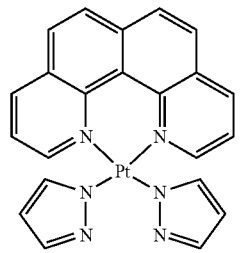
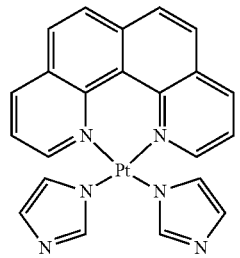
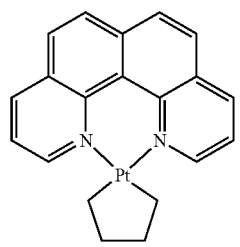
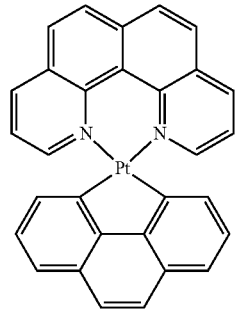
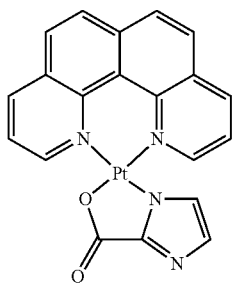
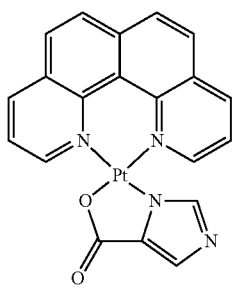
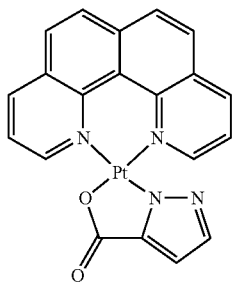
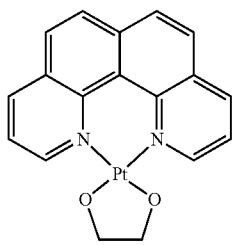
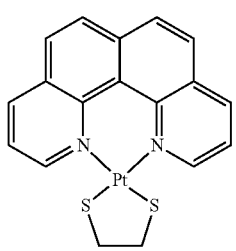

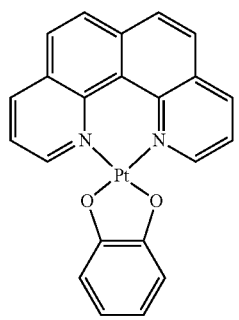
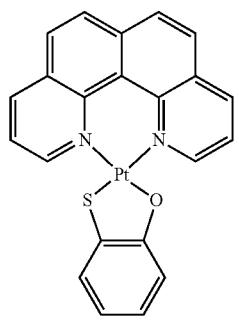
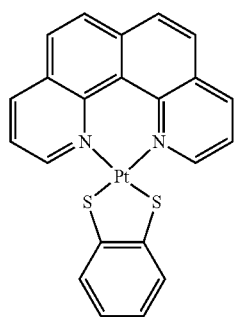
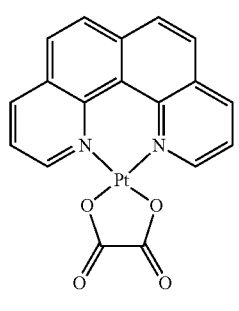
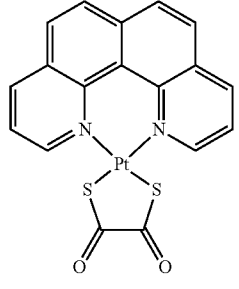
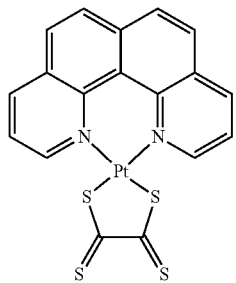
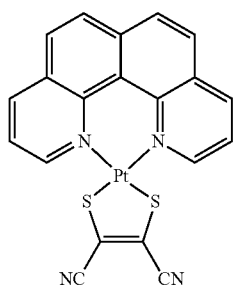
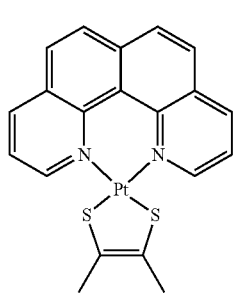
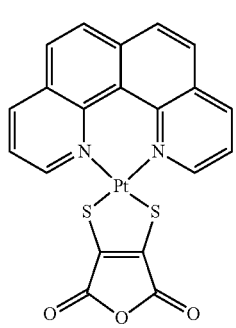
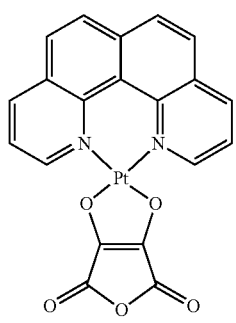

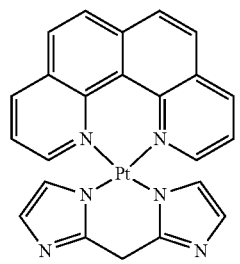
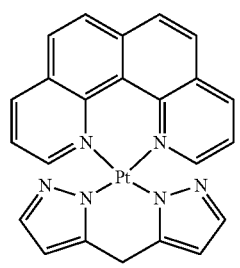
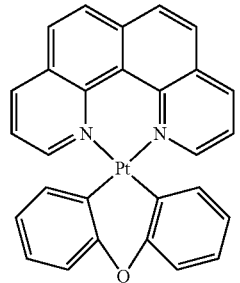
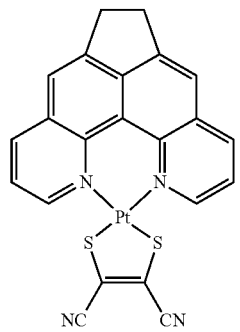
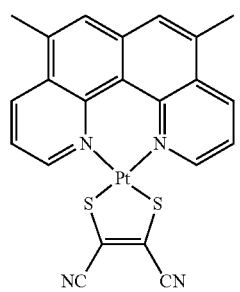
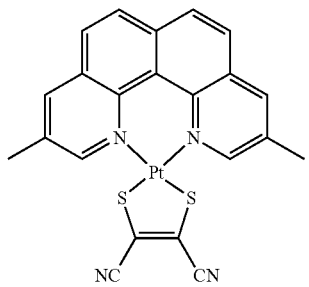
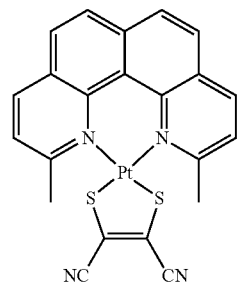
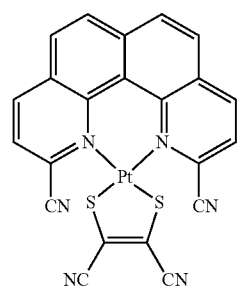
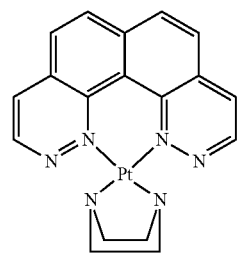
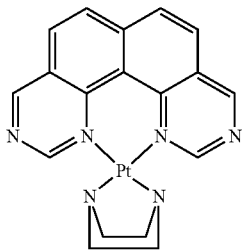
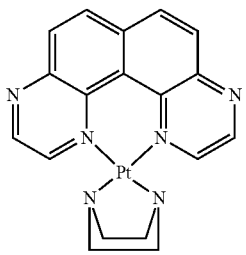

31
-continued
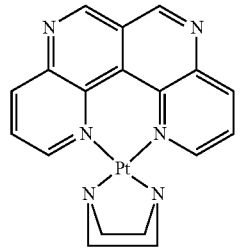
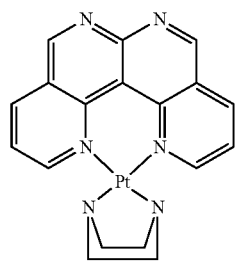
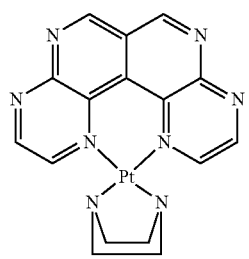
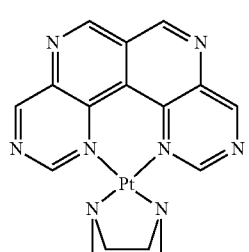
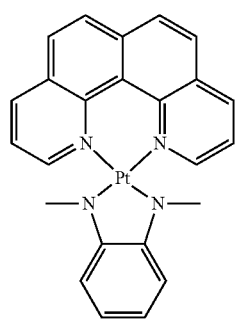
32
-continued
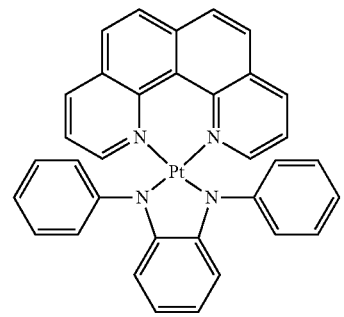
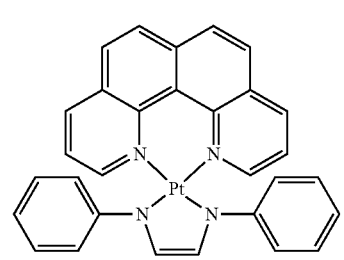
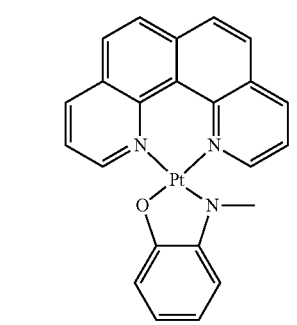
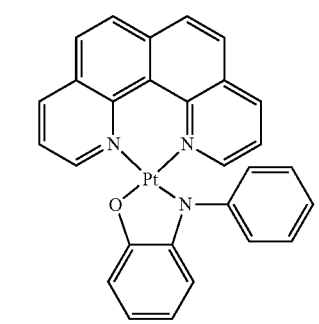
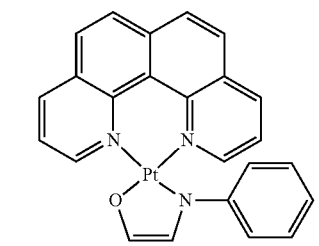

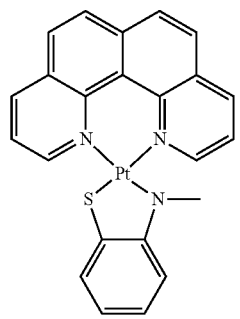
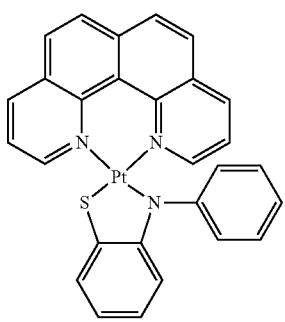
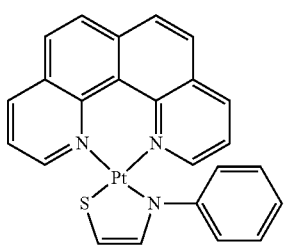
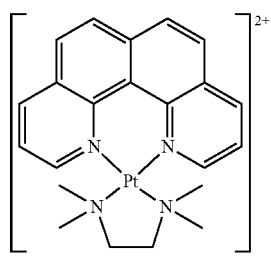
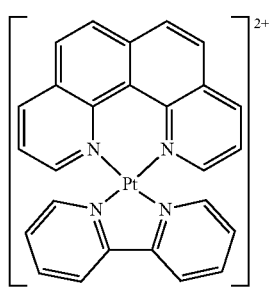
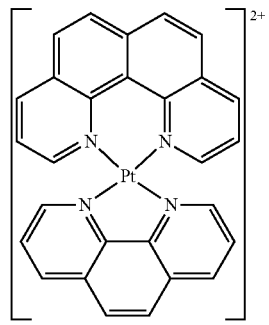
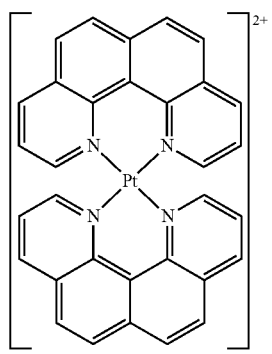
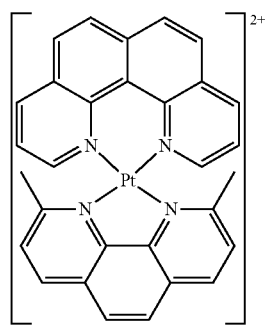
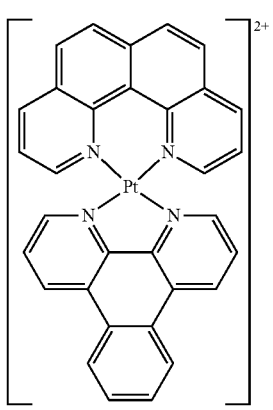

-continued
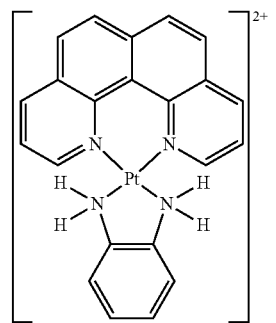
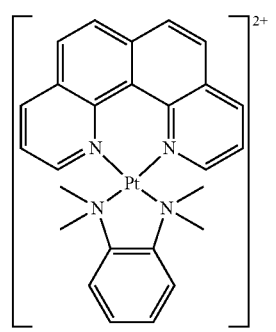
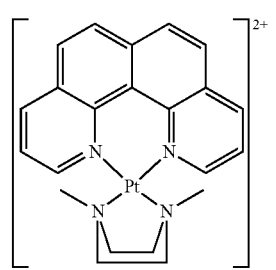
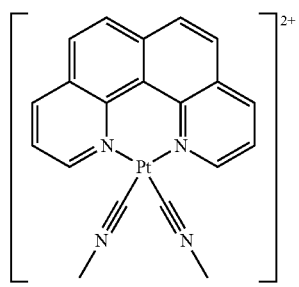
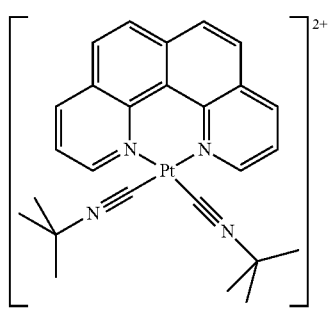
-continued
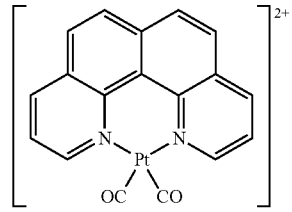
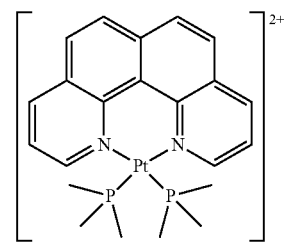
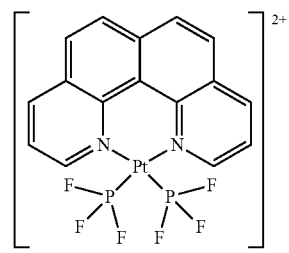
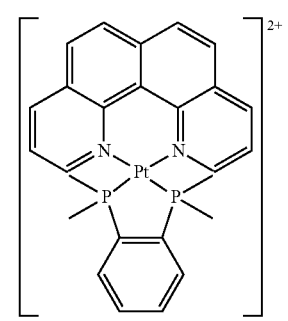
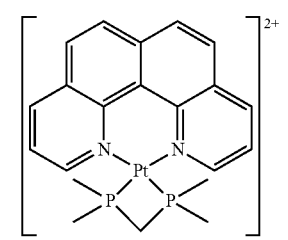
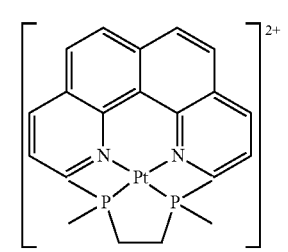

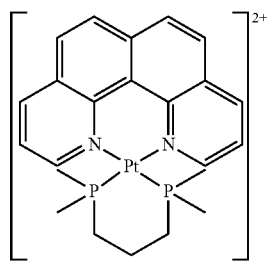
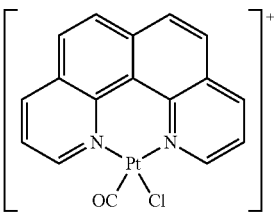
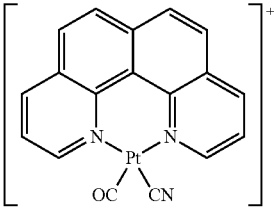
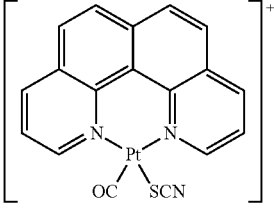
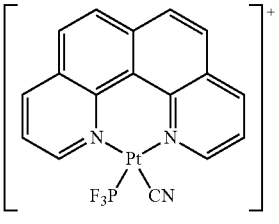
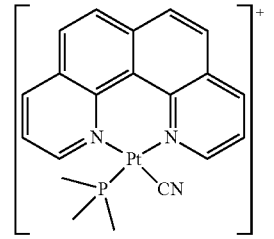
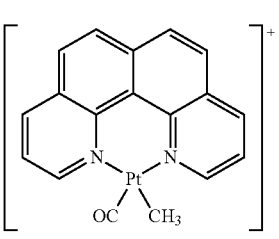
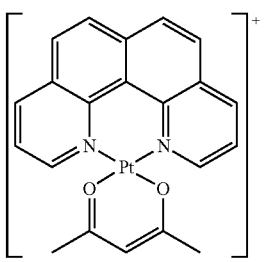
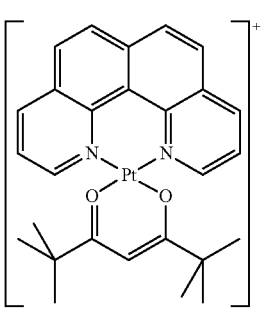
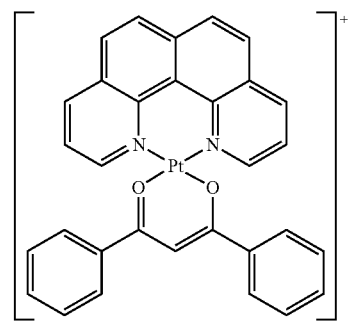
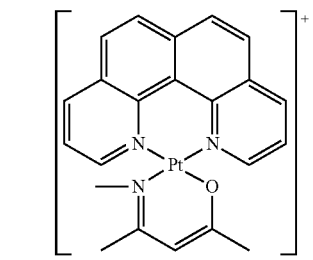
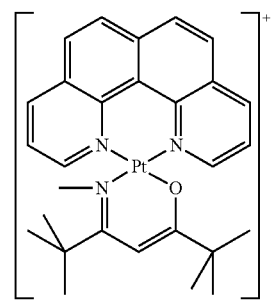

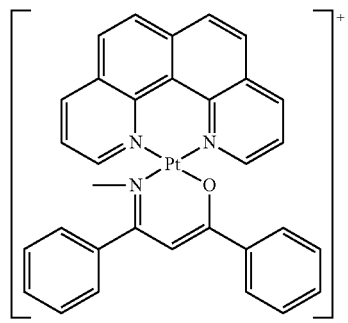
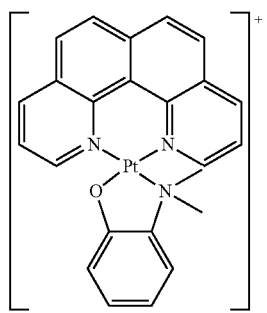
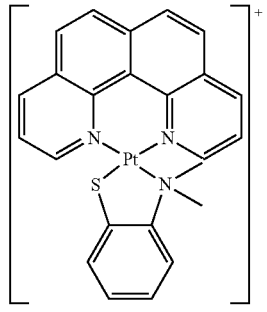
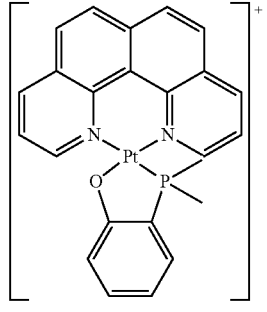
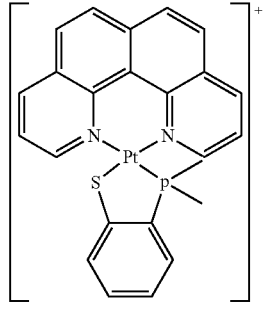
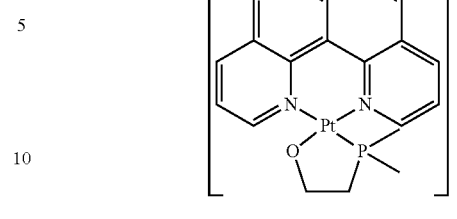
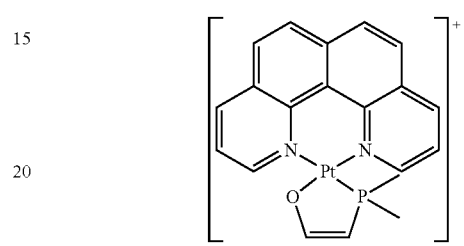
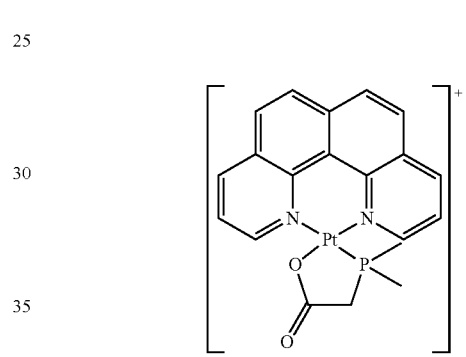
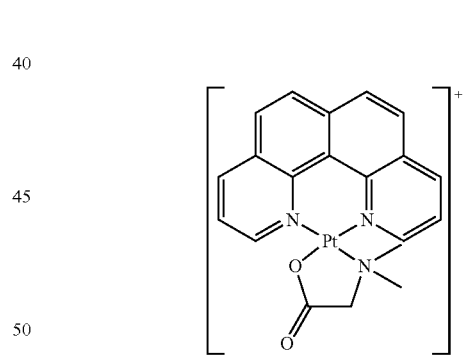
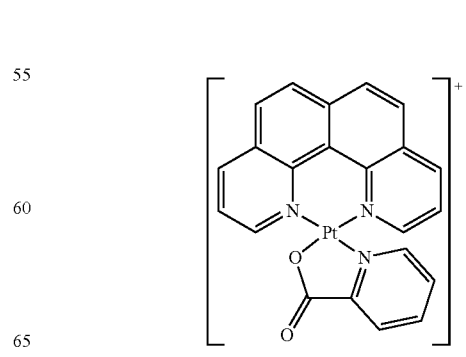

41
-continued
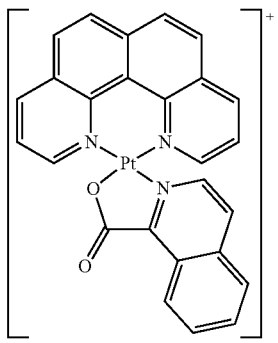
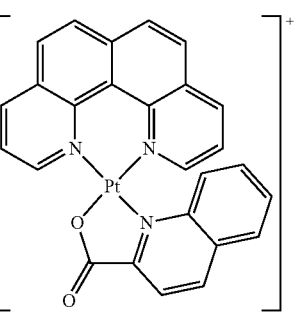
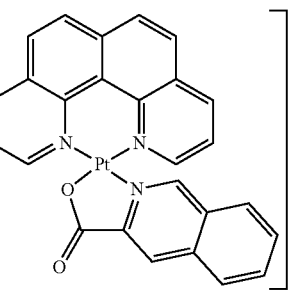
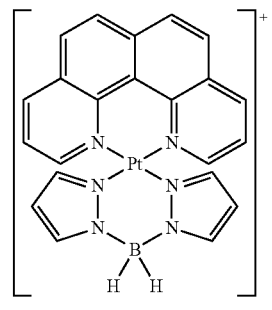
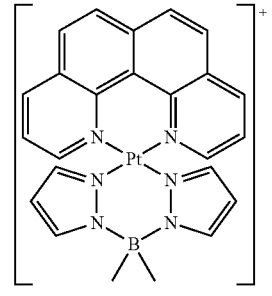
42
-continued
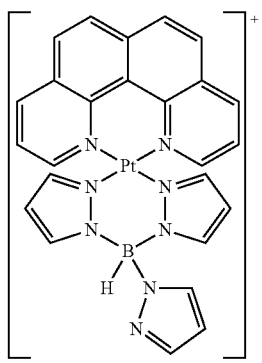
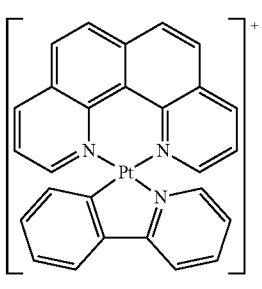
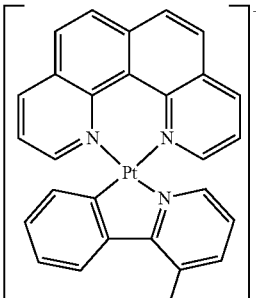
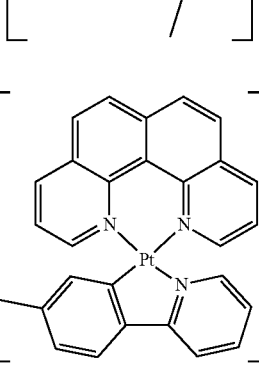
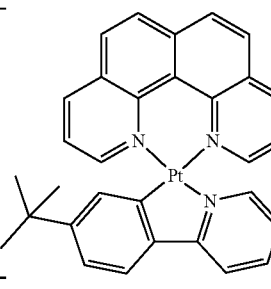

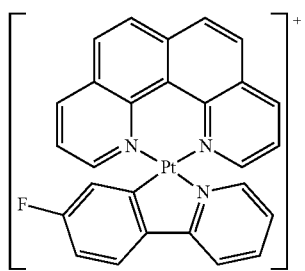
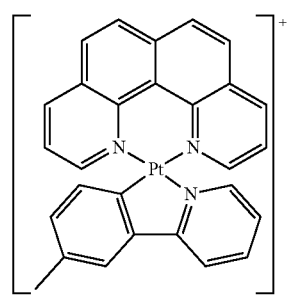
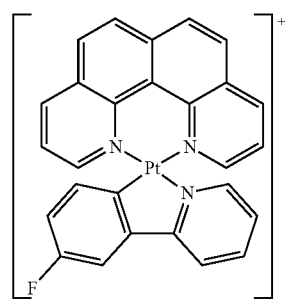
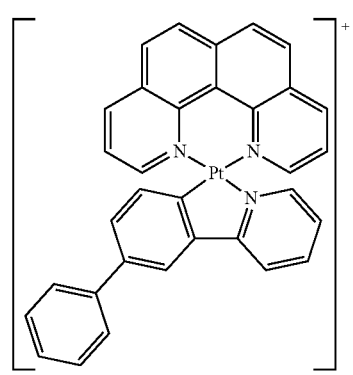
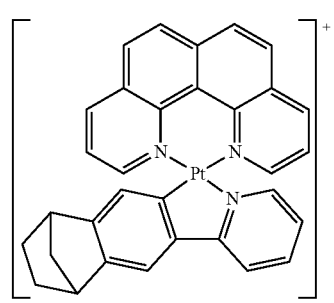
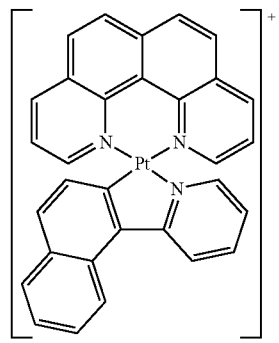
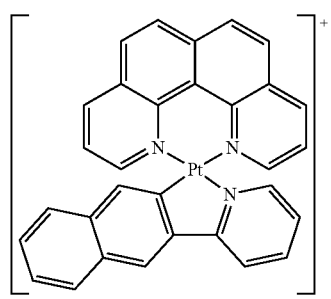
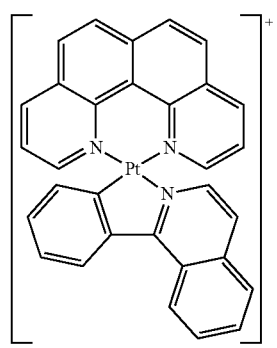
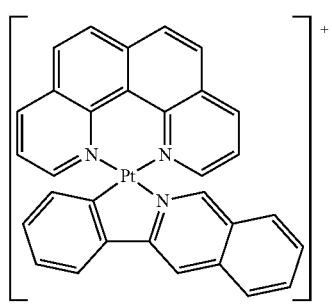
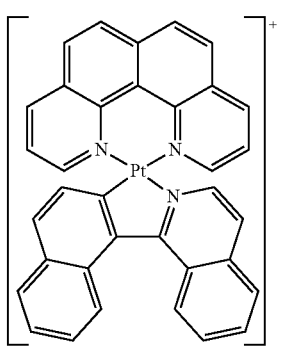

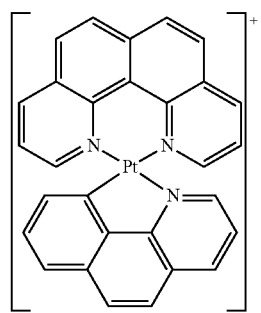
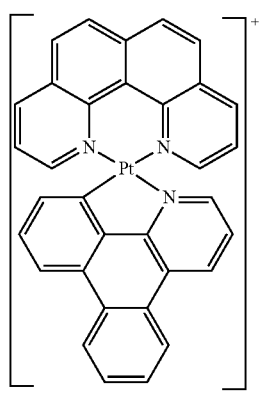
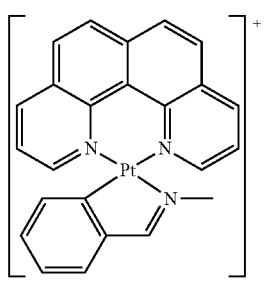
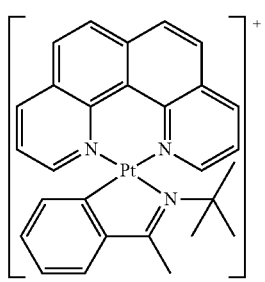
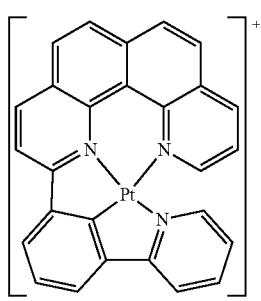
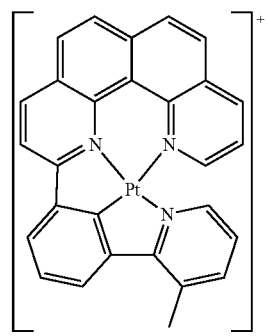
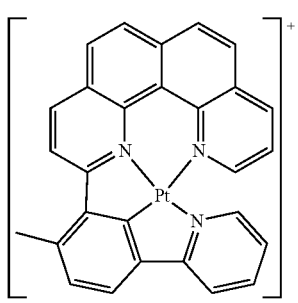
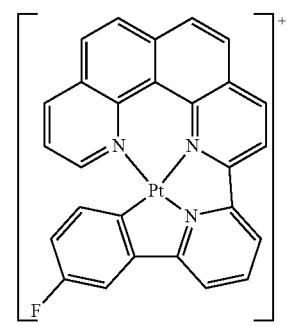
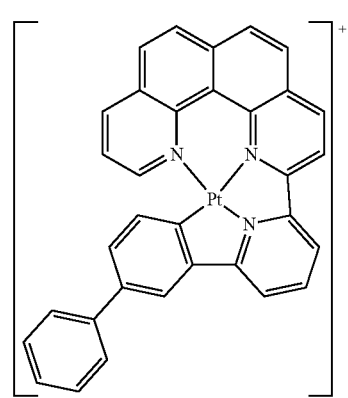

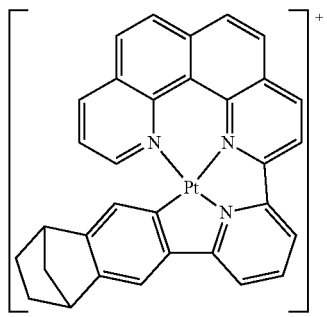
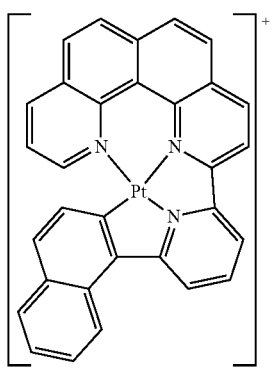
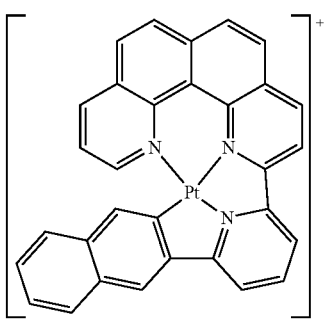
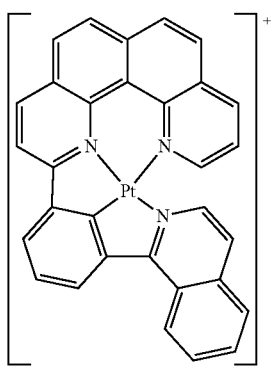
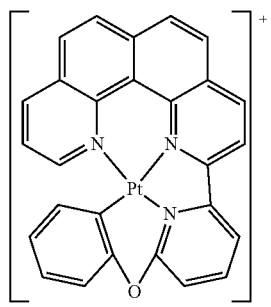
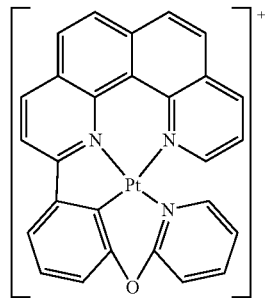
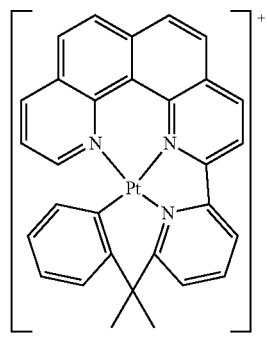
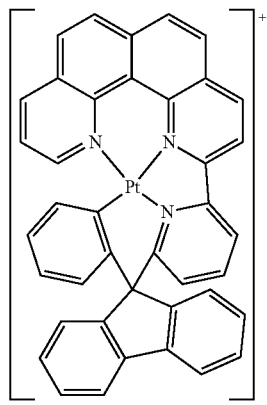

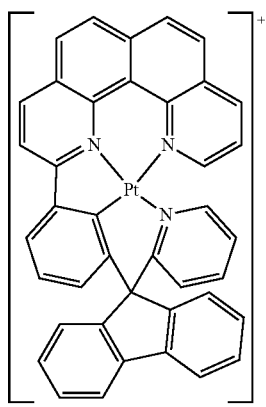
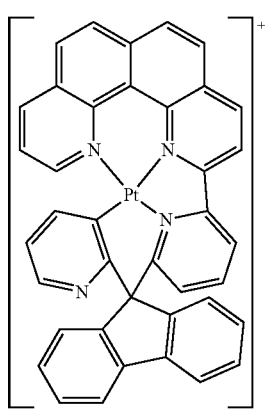
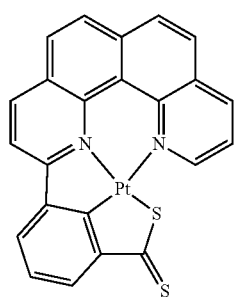
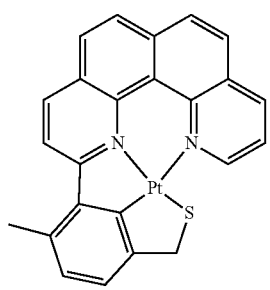
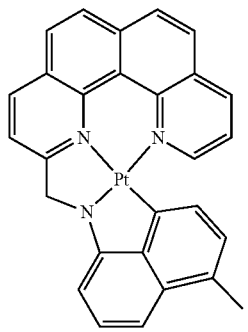
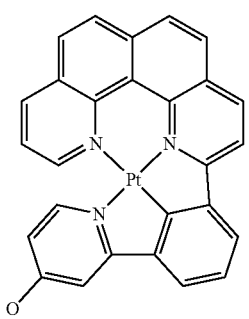
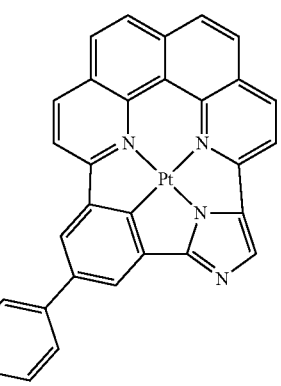
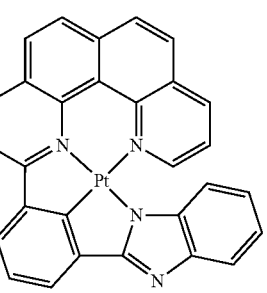
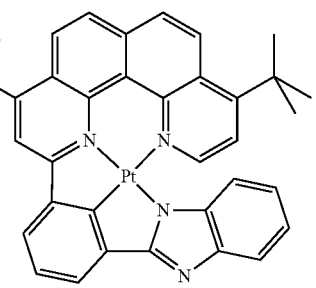

51
-continued
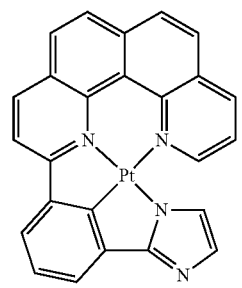
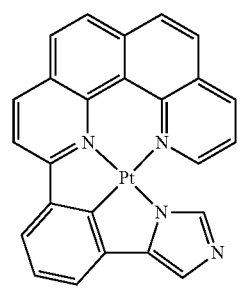
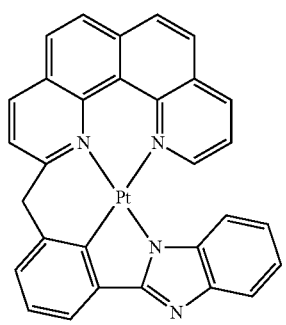
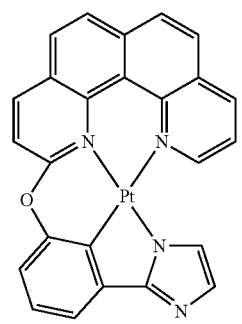
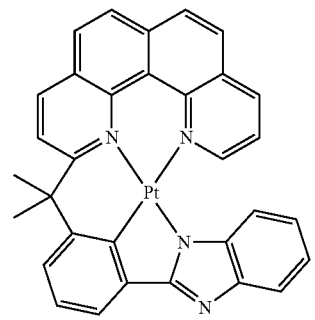
52
-continued
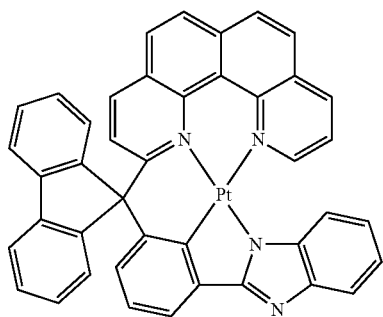
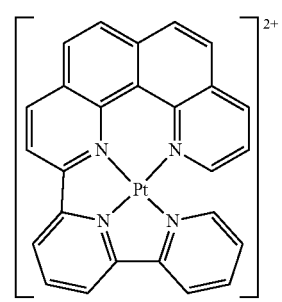
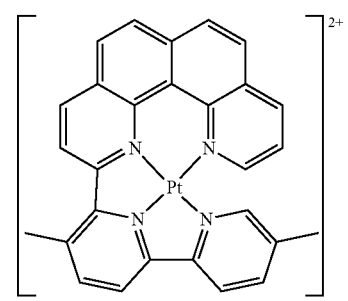
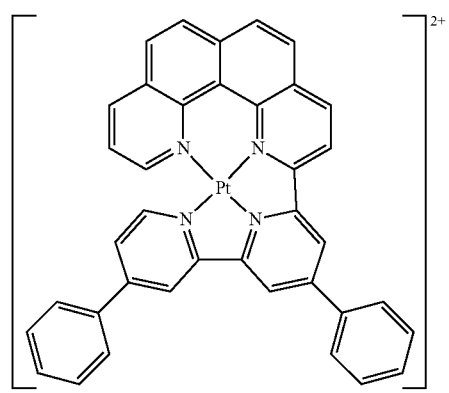

-continued
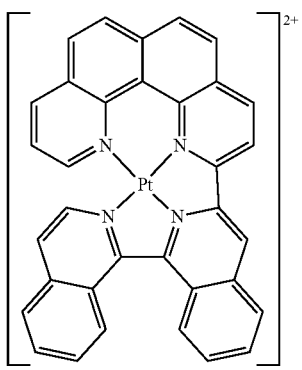
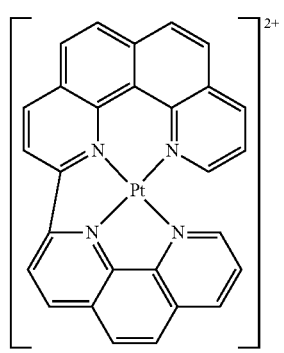
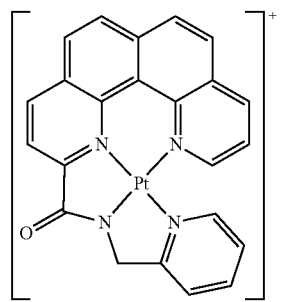
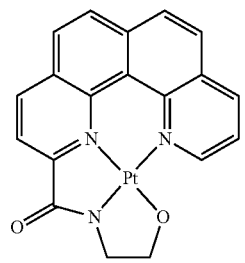
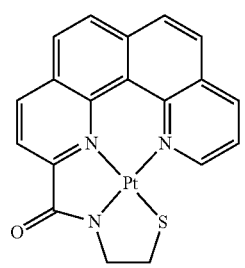
-continued
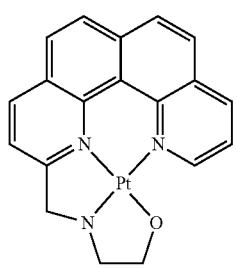
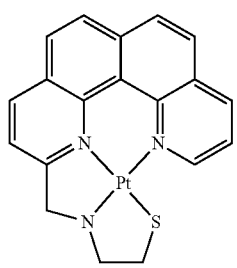
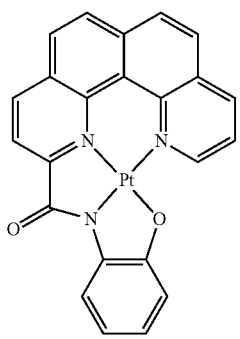
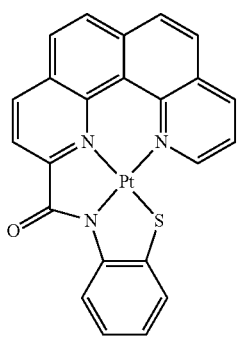
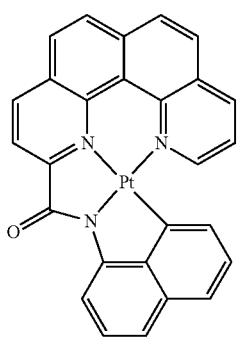

-continued
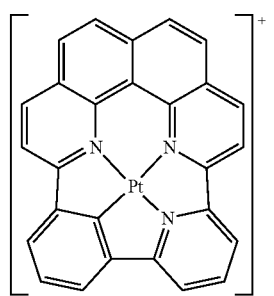
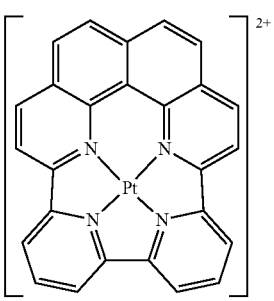
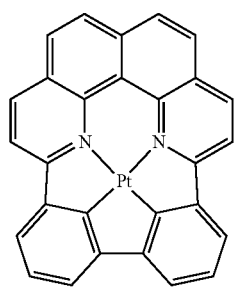
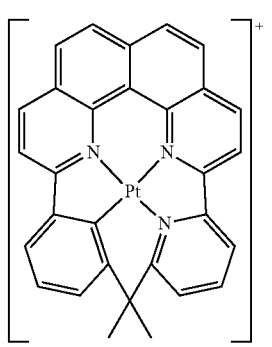
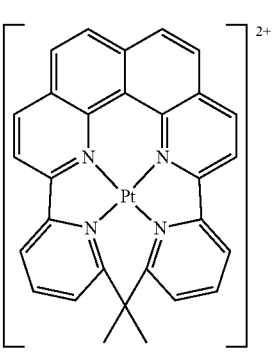
-continued
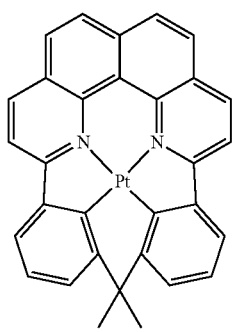
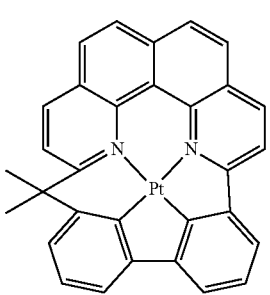
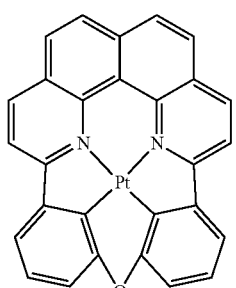
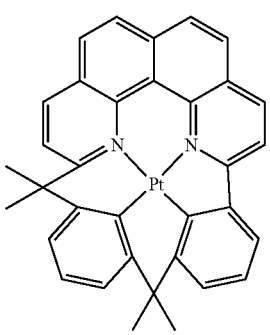
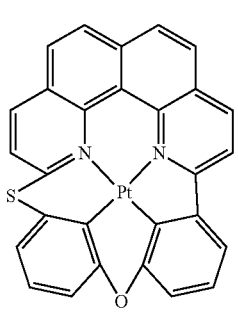

US 9,627,632 B2
| 57 -continued | 58 -continued |
|---|---|
| 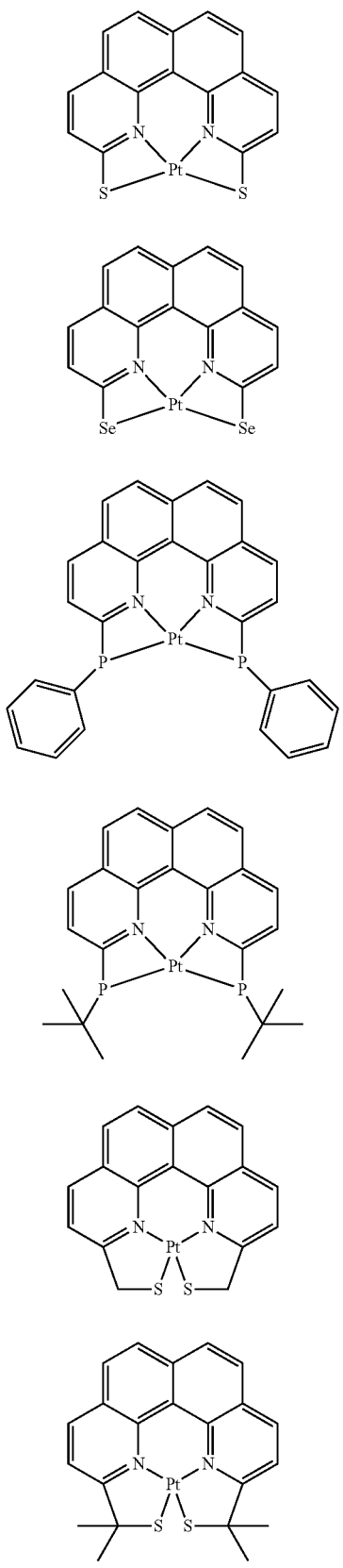 | 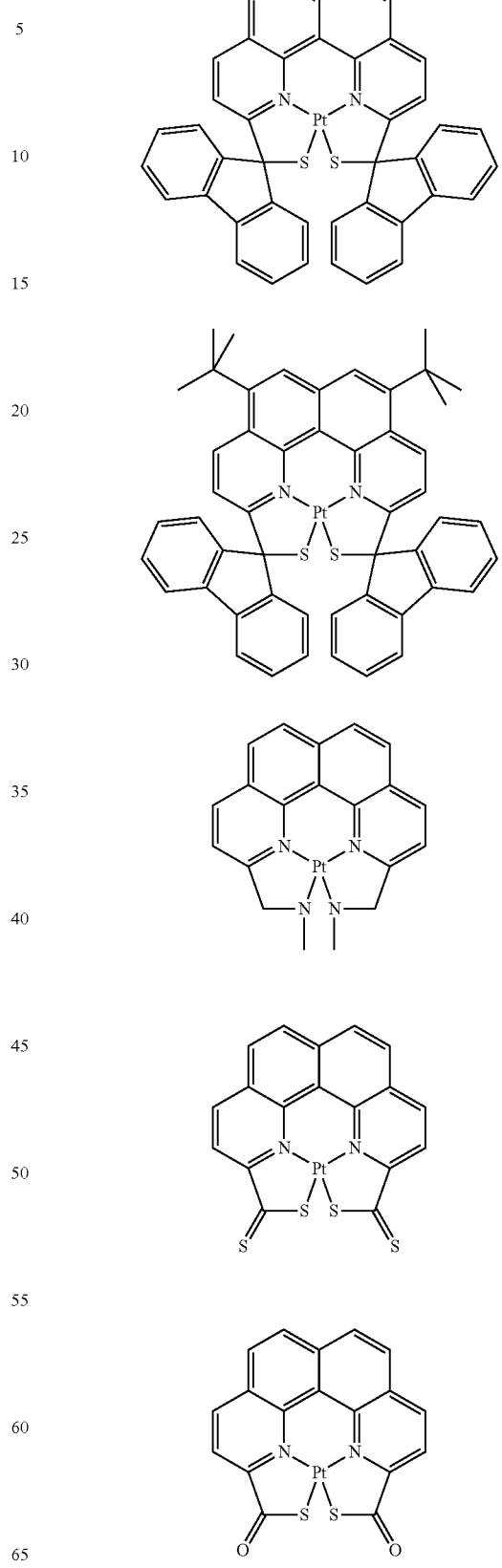 |

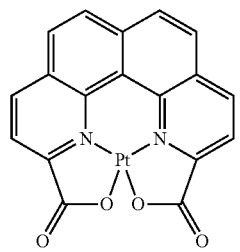
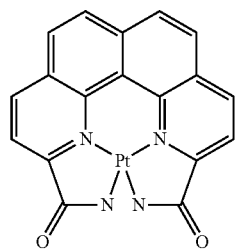
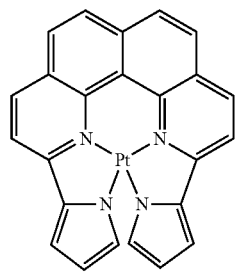
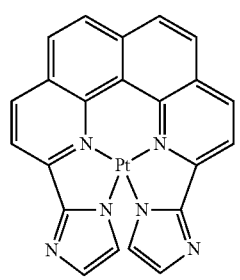
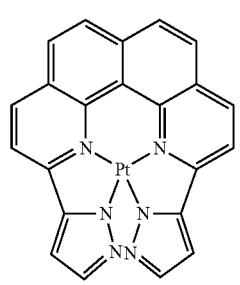
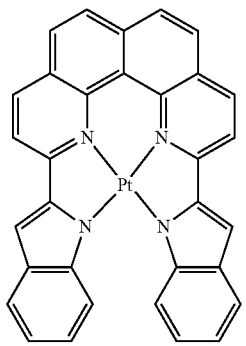
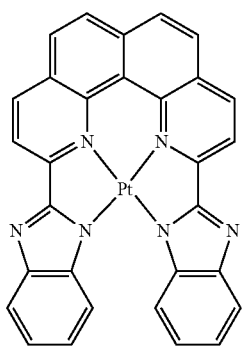
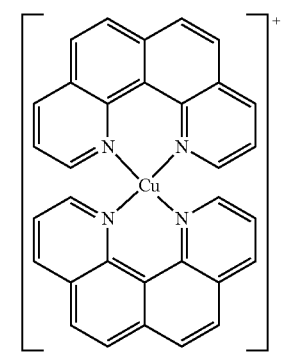
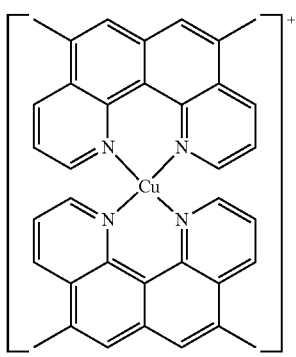

-continued
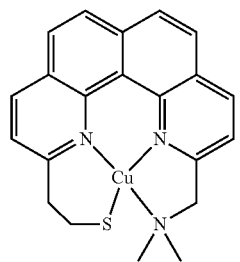
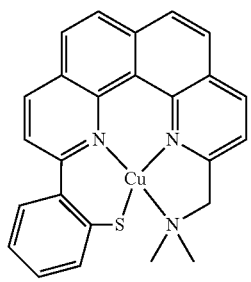
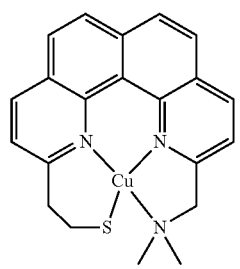
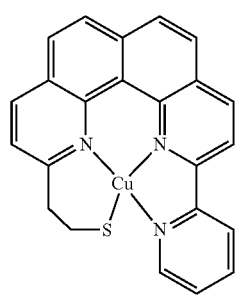
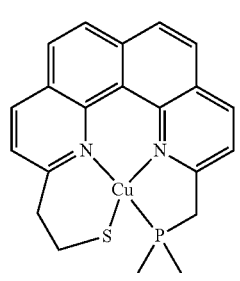
-continued
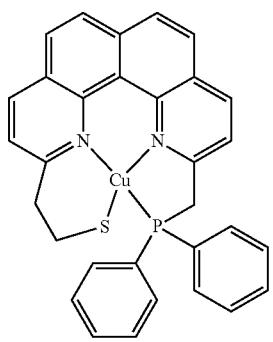
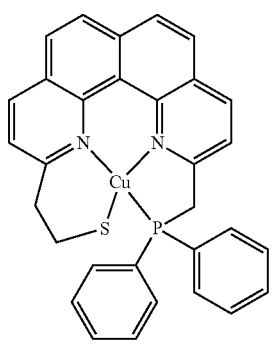
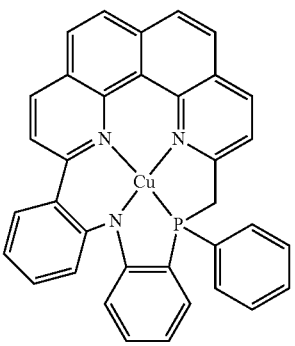
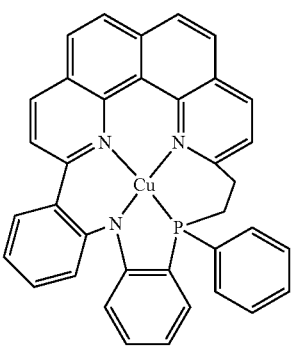

-continued
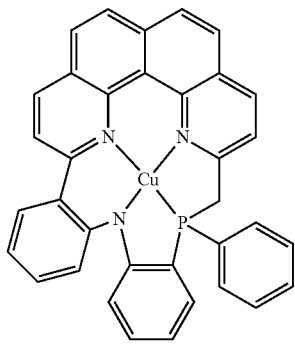
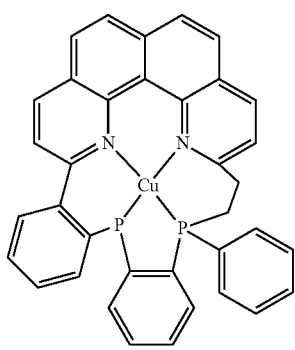
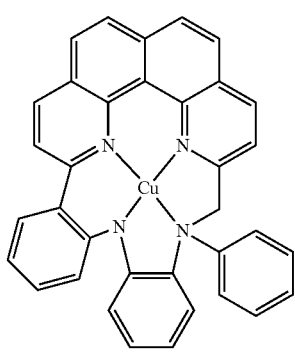
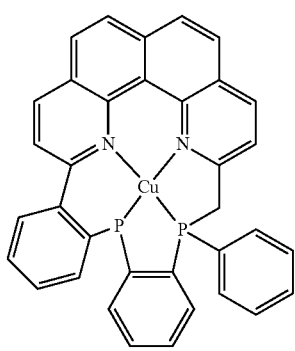
-continued
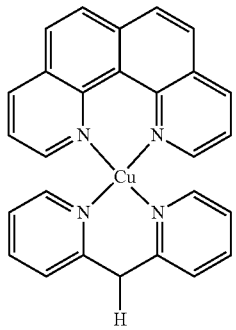
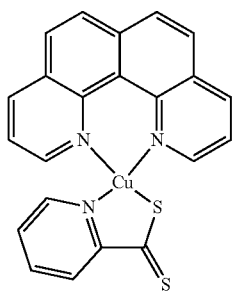
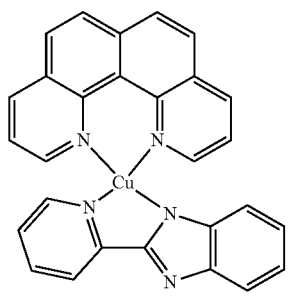
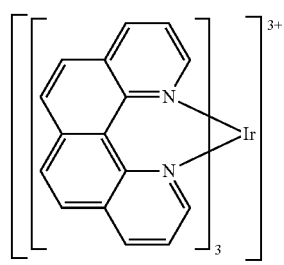
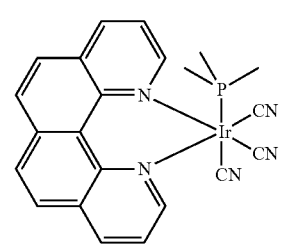

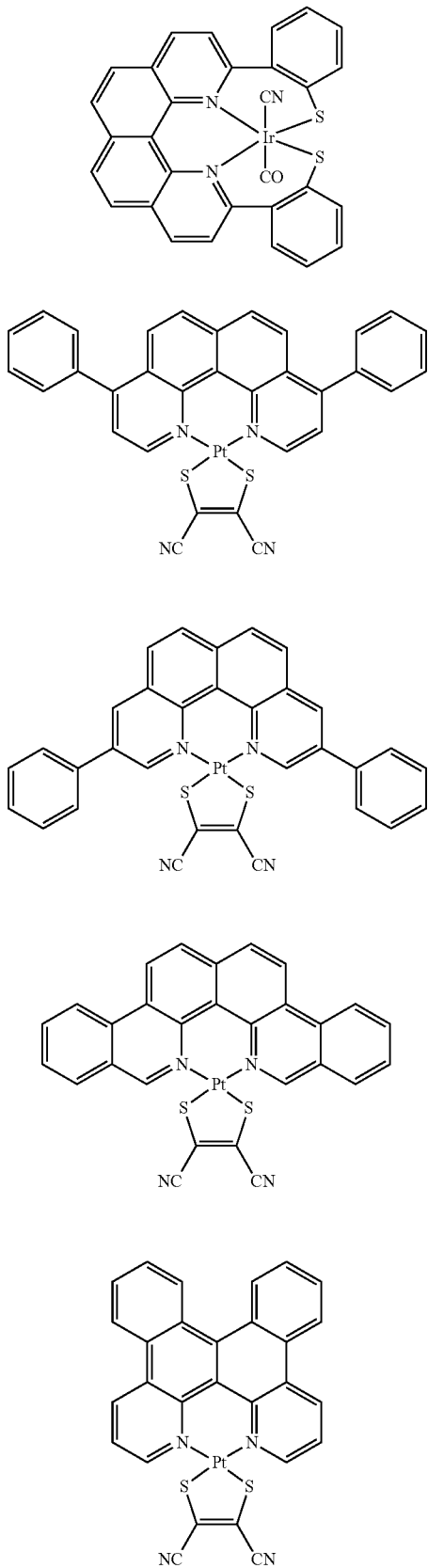
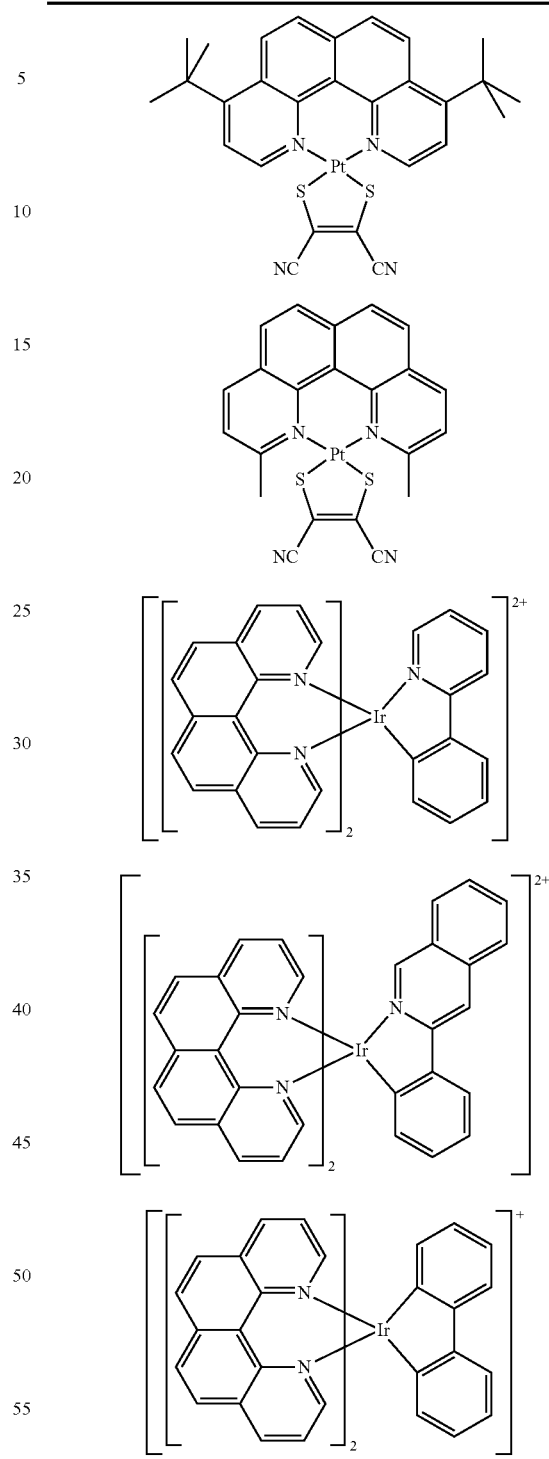

The compounds of the invention have the following advantages over compounds according to the prior art:
1. The compounds of the invention have a high thermal stability. Thus, the low molecular weight compounds can be vaporized in a high vacuum without decomposition, and the oligomeric, dendritic and polymeric compounds are also very thermally stable, so that the devices can be treated thermally without damage. This property is a basic prerequisite for reproducible production of OLEDs and has, in particular, a positive effect on the operating lifetime. Furthermore, ressource-conserving utilization of compounds of these rare metals is thus possible, since the complexes can be sublimed virtually without losses in the purification and production of devices.

2. The compounds of the invention display a good solubility in organic solvents, which makes their purification by means of customary methods such as recrystallization or chromatography considerably easier. The compounds can thus also be processed from solution by means of coating or printing techniques. This property is also advantageous in the customary processing by vaporization, since cleaning of the equipment or the shadow masks used is made considerably easier as a result.

3. The compounds of the invention display improved oxidation stability, which has a positive effect on purification and generally on the handling of these compounds.

4. The compounds of the invention can be prepared reproducibly in high purity and display no batch-to-batch variation. An industrial process for producing the electroluminescence devices of the invention is therefore significantly more efficient.

5. The synthesis of the ligands is simpler and comprises fewer steps than the synthesis of the ligands in WO 04/081017. This is a significant industrial advantage.

The present invention is illustrated by the following examples without being restricted thereto. A person skilled in the art will be able to prepare further compounds according to the invention or use these in organic electronic devices on the basis of the information given without making a further inventive step.

EXAMPLES

Example 1

Production and Characterisation of Organic Electroluminescent Devices

Electroluminescent devices according to the invention can be produced as described, for example, in WO 05/003253.

OLEDs having the following structure are produced analogously to the general process mentioned above:

| | |
|---|---|
| Hole-injection layer (HIL) | 20 nm of 2,2',7,7'-tetrakis(di-para-tolyl-amino)spiro-9,9'-bifluorene |
| Hole-transport layer (HTL) | 20 nm of NPB (N-naphthyl-N-phenyl-4,4'-diaminobiphenyl) |
| Electron blocking layer (EBL) | 15 nm of 9,9'-Bis-(3,5-diphenylaminophenyl)fluoren |
| Emission layer (EML) | 40 nm of host material:<br>a) spiroketone (SK), Bis(9,9'-spirobifluoren-2-yl) ketone<br>b) mixed matrix: 30% diazasilol + 55% keton<br>Dopant 1 or 2: 10% and 15% by vol. doping; compound see below |
| Hole-blocking layer (HBL) | 10 nm of SK |
| Electron conductor (ETL) | 20 nm of AlQ$_3$ (tris(quinolinato)aluminium-(III)) |
| Cathode | 1 nm of LiF, 100 nm of Al on top. |

The structures of SK and dopant 1 are shown below for clarity.

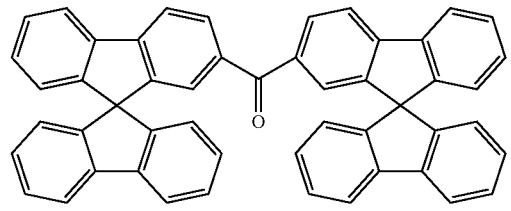

spiroketone (SK)
WO 04/093207

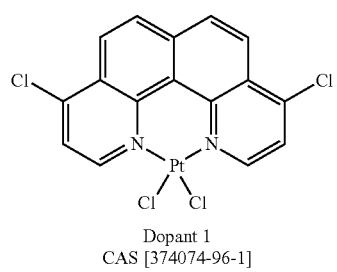

Dopant 1
CAS [374074-96-1]

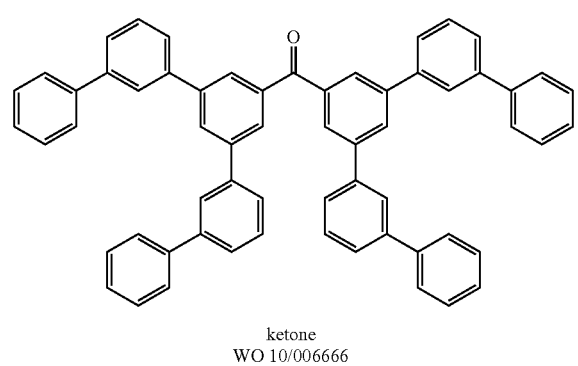

ketone
WO 10/006666

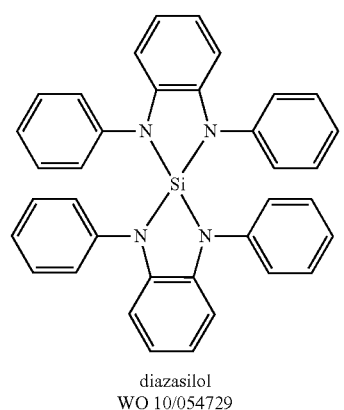

diazasilol
WO 10/054729

This as yet unoptimised OLEDs is characterised by standard methods; for this purpose, the electroluminescence spectra, the efficiency (measured in cd/A) as a function of the luminance, the operating voltage, calculated from current-voltage-luminance characteristic lines (IUL characteristic lines), and the lifetime are determined.

TABLE 1

| | | Device results | | |
|---|---|---|---|---|
| Ex. | EML | Max. eff. [cd/A] at 1000 cd/m² | Voltage [V] at 1000 cd/m² | CIE (x, y) |
| 1a | a): Dopant 1 (10%) | 15.4 | 4.9 | 0.32/0.61 |
| 1b | a): Dopant 1 (15%) | 29.2 | 4.6 | 0.33/0.62 |
| 1c | b): Dopant 2 (15%) | 31.6 | 4.8 | 0.18/0.42 |

Example 2

Synthesis of Dopant 2

A) 4,9-Bis-(2,4,6-trimethylphenyl)-1-12-diaza-benzo[c]phenanthren

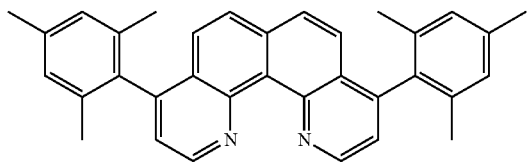

A mixture of 3.0 g (10 mmol) of 4,9-di-chloro-1,12-diaza-benzo[c]-phenanthrene, 6.6 g (40 mmol) 2,4,6-trimethyl-benzene boronic acid, 3.5 g (60 mmol) potassium fluoride, 142 mg (0.7 mmol) tri-tert-butyl-phosphine and 112 g (0.5 mmol) palladium(II)acetate in 80 ml of dioxane is stirred at 100° C. for 30 h. The mixture is allowed to cool to 60° C. and then 200 ml of a mixture of methanol:water (1:1, v:v) is added dropwise. After stirring for another 2 h at room temperature, the precipitate is filtered off, washed twice with 50 ml of methanol each and then dried in vacuum. The raw product is re-dissolved in 300 ml of dichloromethane and filtered through a short column of silica, in order to remove residual palladium. The product obtained after removal of the dichloromethane is re-crystallized twice form DMF. Yield: 2.9 g (6.2 mmol) 62%.

B) 4,9-Bis-(2,4,6-trimethylphenyl)-1-12-diaza-benzo[c]phenanthrene-di-cyano-platinum(II)

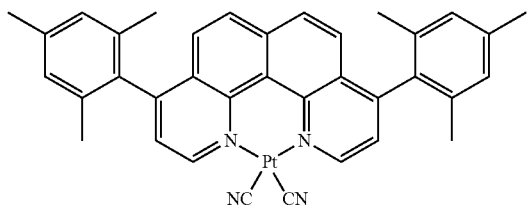

A mixture of 2.3 g (5 mmol) 4,9-bis-(2,4,6-trimethylphenyl)-1-12-diaza-benzo[c]phenanthrene and 1.2 g (5 mmol) Pt(CN)₂ in 50 ml DMF is heated to reflux for 18 h. The mixture is allowed to cool to room temperature, the precipitate is filtered off, washed with methanol and then dried in vacuum. The raw product is re-crystallised three times form DMSO and then further purified by repeated fractioned sublimation (p app. 10⁻⁶ mbar, T 340-360° C.). Yield: 1.4 g (2 mmol) 39%.

The invention claimed is:
1. An uncharged compound of the formula (1)

$$M(L)_n(L')_m(L'')_o \qquad \text{Formula (1)}$$

containing a substructure $M(L)_n$ of formula (6)

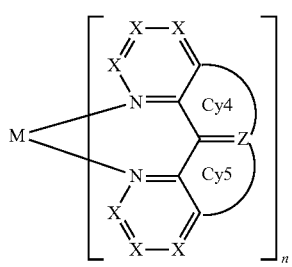

Formula (6)

wherein the symbols and indices used have the following meanings:
Cy4 and Cy5 are identical or different on each occurrence selected such that they form an aliphatic, aromatic or heteroaromatic ring system;
X is identical or different on each occurrence C(R¹) or N provided that at maximum 2 adjacent X are represented by N;
R¹ is identical or different on each occurrence selected from the group consisting of H, D, F, Cl, Br, I, CN, NO₂, CNO, NCS, SCN, CF₃, a straight-chain alkyl, alkoxy or thioalkoxy group having from 1 to 40 carbon atoms or a branched, cyclic or polycyclic alkyl, alkoxy or thioalkoxy group having from 3 to 40 carbon atoms or an alkenyl or alkynyl group having from 2 to 40 carbon atoms, wherein optionally at least one of the carbon atoms of the alkyl, alkoxy, thioalkoxy, alkenyl or alkynyl group is substituted by one or more groups R², wherein optionally in each case one or more nonadjacent CH₂ groups is replaced by —R²C=CR²—, —C≡C—, Si(R²)₂, Ge(R²)₂, Sn(R²)₂, C=O, C=S, C=Se, C=NR², P(=O)(R²), SO, SO₂, NR², O, S or CONR²; and wherein optionally one or more H atoms is replaced by F, Cl, Br, I, CN or NO₂; or an aromatic or heteroaromatic ring system having from 5 to 60 aromatic ring atoms which is optionally substituted by one or more radicals R², or an aryloxy or heteroaryloxy group having from 5 to 60 aromatic ring atoms which is optionally substituted with one or more radicals R², or a combination of said systems, wherein two or more adjacent substituents R¹ may form together with the atoms to which they are bonded a monocyclic or heterocyclic aliphatic, aromatic or heteroaromatic ring system which ring system is optionally substituted with one or more radicals R²;
Z is C;
M is Zr, Hf, Mo, W, Ru, Os, Rh, Ir, Ni, Pt, Cu, Ag or Au;
R is identical or different on each occurrence and is in each case H, D, F, CN, a straight-chain alkyl or alkoxy group having from 1 to 40 carbon atoms or a branched or cyclic alkyl or alkoxy group having from 3 to 40 carbon atoms or an alkenyl or alkynyl group having from 2 to 40 carbon atoms, where in each case one or more non-adjacent CH₂ groups is optionally replaced by —R²C=CR²—, —C≡C—, Si(R²)₂, Ge(R²)₂, Sn(R²)₂, —O—, —S—, —NR²—, —(C=O)—, —(C=NR²)—, —P=O(R²)—, SO, SO₂ or —CONR²— and one or more H atoms is optionally replaced by F, or an aromatic or heteroaromatic ring system having from 5 to 60 aromatic ring atoms or an aryloxy or a heteroaryloxy group having from 5 to 60 aromatic ring atoms which in each case is optionally substituted by one or more nonaromatic radicals $R^2$, or a combination of two, three or four of these systems;

$R^2$ is identical or different on each occurrence selected from the group consisting of an aliphatic hydrocarbon having from 1 to 20 C atoms, an aromatic or heteroaromatic ring system having from 5 to 30 aromatic ring atoms, in which one or more H atoms is optionally replaced by F, Cl, Br, I, CN or $NO_2$, wherein two or more adjacent substituents $R^2$ form together with the atoms to which they are bonded a mono- or polycyclic aliphatic, aromatic or heteroaromatic ring system;

n is 1, 2 or 3;

wherein the ligands L' and L" in the formula (1) are identical or different and are monodentate, bidentate or tridentate chelating ligands, which can also bind to the ligand L;

m and o are identical or different on each occurrence and are in each case 0, 1 or 2; and n+m+o=2 or 3;

with the proviso that when n=1 and L is part of a tetradentate ligand then the tetradentate ligand has no M-C bond;

and furthermore with the proviso that compounds of the following formula are excluded from the invention:

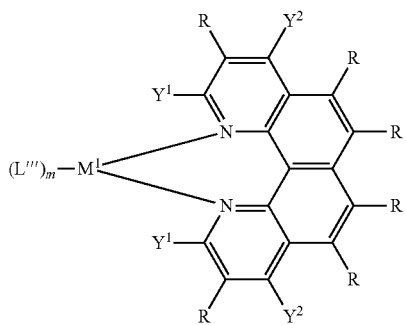

where R and m have the same meanings as specified above and furthermore:

$M^1$ is Zr, Hf, Mo, W, Ru, Os, Rh, Ir, Ni, Pt, Cu, Ag or Au;

$Y^1$ is identical or different on each occurrence H, halogen, a carboxyl, carboxylate, substituted or unsubstituted alkyl group, OH or amino group;

$Y^2$ is identical or different on each occurrence H, halogen, an alkoxy, OH, nitro or amino group;

L''' is a ligand.

2. The compound according to claim 1, wherein the partial structure of formula (6) is represented by formula (8), Formula (8)

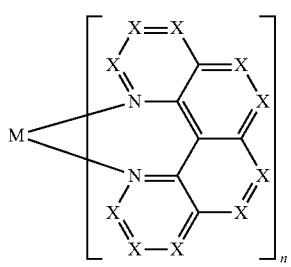

X is identical or different on each occurrence $C(R^1)$ or N provided that at maximum 2 adjacent X are represented by N;

$R^1$ is identical or different on each occurrence selected from the group consisting of H, D, F, Cl, Br, I, CN, $NO_2$, CNO, NCS, SCN, $CF_3$, a straight-chain alkyl, alkoxy or thioalkoxy group having from 1 to 40 carbon atoms or a branched, cyclic or polycyclic alkyl, alkoxy or thioalkoxy group having from 3 to 40 carbon atoms or an alkenyl or alkynyl group having from 2 to 40 carbon atoms, wherein optionally at least one of the carbon atoms of the alkyl, alkoxy, thioalkoxy, alkenyl or alkynyl group is substituted by one or more groups $R^2$, wherein optionally in each case one or more nonadjacent $CH_2$ groups is replaced by $-R^2C=CR^2-$, $-C\equiv C-$, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$; and wherein optionally one or more H atoms is replaced by F, Cl, Br, I, CN or $NO_2$; or an aromatic or heteroaromatic ring system having from 5 to 60 aromatic ring atoms which is optionally substituted by one or more radicals $R^2$, or an aryloxy or heteroaryloxy group having from 5 to 60 aromatic ring atoms which is optionally substituted with one or more radicals $R^2$, or a combination of said systems, wherein two or more adjacent substituents $R^1$ may form together with the atoms to which they are bonded a monocyclic or heterocyclic aliphatic, aromatic or heteroaromatic ring system which ring system is optionally substituted with one or more radicals $R^2$; and $R^2$ is identical or different on each occurrence selected from the group consisting of an aliphatic hydrocarbon having from 1 to 20 C atoms, an aromatic or heteroaromatic ring system with 5 to 30 aromatic ring atoms, in which one or more H atoms is optionally replaced by F, Cl, Br, I, CN or $NO_2$, wherein two or more adjacent substituents $R^2$ form together with the atoms to which they are bonded a mono- or polycyclic aliphatic, aromatic or heteroaromatic ring system.

3. The compound according to claim 1, wherein the partial structure of formula (6) is represented by formula (10), Formula (10)

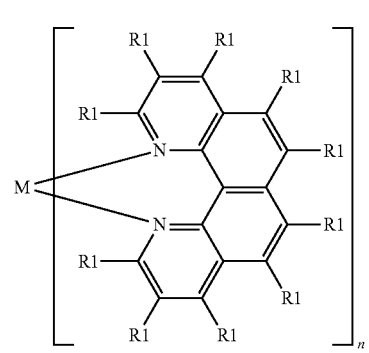

$R^1$ is identical or different on each occurrence selected from the group consisting of H, D, F, Cl, Br, I, CN, $NO_2$, CNO, NCS, SCN, $CF_3$, a straight-chain alkyl, alkoxy or thioalkoxy group having from 1 to 40 carbon atoms or a branched, cyclic or polycyclic alkyl, alkoxy or thioalkoxy group having from 3 to 40 carbon atoms or an alkenyl or alkynyl group having from 2 to 40 carbon atoms, wherein optionally at least one of the carbon atoms of the alkyl, alkoxy, B thioalkoxy, alkenyl or alkynyl group is substituted by one or more groups $R^2$, wherein optionally in each case one or more nonadjacent $CH_2$ groups is replaced by —$R^2C$=$CR^2$—, —C≡C—, $Si(R^2)_2$, $Ge(R^2)_2$, $Sn(R^2)_2$, C=O, C=S, C=Se, C=$NR^2$, P(=O)($R^2$), SO, $SO_2$, $NR^2$, O, S or $CONR^2$; and wherein optionally one or more H atoms is replaced by F, Cl, Br, I, CN or $NO_2$; or an aromatic or heteroaromatic ring system having from 5 to 60 aromatic ring atoms which is optionally substituted by one or more radicals $R^2$, or an aryloxy or heteroaryloxy group having from 5 to 60 aromatic ring atoms which is optionally substituted with one or more radicals $R^2$, or a combination of said systems, wherein two or more adjacent substituents $R^1$ may form together with the atoms to which they are bonded a monocyclic or heterocyclic aliphatic, aromatic or heteroaromatic ring system which ring system is optionally substituted with one or more radicals $R^2$; and $R^2$ is identical or different on each occurrence selected from the group consisting of an aliphatic hydrocarbon having from 1 to 20 C atoms, an aromatic or heteroaromatic ring system with 5 to 30 aromatic ring atoms, in which one or more H atoms is optionally replaced by F, Cl, Br, I, CN or $NO_2$, wherein two or more adjacent substituents $R^2$ form together with the atoms to which they are bonded a mono- or polycyclic aliphatic, aromatic or heteroaromatic ring system.

4. The compound according to claim 1, wherein the metal M is Ir, Pt or Cu.

5. An uncharged compound of the formula (1)

$$M(L)_n(L')_m(L'')_o \qquad \text{Formula (1)}$$

containing a substructure $M(L)_n$ of the formula (11) or (12),

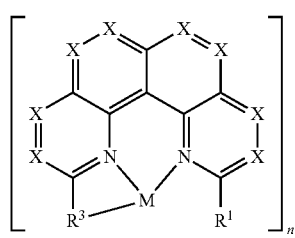

Formula (11)

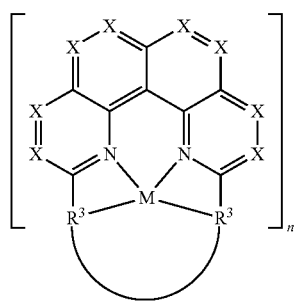

Formula (12)

wherein
$R^3$ is a group coordinated to M and is selected such that a 5-, 6-, or 7-ring chelate is formed wherein $R^3$ comprises a donor group selected from C, N, P, O or S;
the half cycle in formula (12) represents a group necessary to form an aliphatic, aromatic or heteroaromatic ring system, but is not necessarily present;
M is Zr, Hf, Mo, W, Ru, Os, Rh, Ir, Ni, Pt, Cu, Ag or Au;

the ligands L' and L" in the formula (1) are identical or different and are monodentate, bidentate or tridentate chelating ligands, which can also bind to the ligand L;
X is identical or different on each occurrence $C(R^1)$ or N provided that at maximum 2 adjacent X are represented by N;
n is 1, 2 or 3;
m and o are identical or different on each occurrence and are in each case 0, 1 or 2; and n+m+o=1 or 2 or 3;
$R^1$ is identical or different on each occurrence selected from the group consisting of H, D, F, Cl, Br, I, CN, $NO_2$, CNO, NCS, SCN, $CF_3$, a straight-chain alkyl, alkoxy or thioalkoxy group having from 1 to 40 carbon atoms or a branched, cyclic or polycyclic alkyl, alkoxy or thioalkoxy group having from 3 to 40 carbon atoms or an alkenyl or alkynyl group having from 2 to 40 carbon atoms, wherein optionally at least one of the carbon atoms of the alkyl, alkoxy, thioalkoxy, alkenyl or alkynyl group is substituted by one or more groups $R^2$, wherein optionally in each case one or more nonadjacent $CH_2$ groups is replaced by —$R^2C$=$CR^2$—, —C≡C—, $Si(R^2)_2$, $Ge(R^2)_2$, $Sn(R^2)_2$, C=O, C=S, C=Se, C=$NR^2$, P(=O)($R^2$), SO, $SO_2$, $NR^2$, O, S or $CONR^2$; and wherein optionally one or more H atoms is replaced by F, Cl, Br, I, CN or $NO_2$; or an aromatic or heteroaromatic ring system having from 5 to 60 aromatic ring atoms which is optionally substituted by one or more radicals $R^2$, or an aryloxy or heteroaryloxy group having from 5 to 60 aromatic ring atoms which is optionally substituted with one or more radicals $R^2$, or a combination of said systems, wherein two or more adjacent substituents $R^1$ may form together with the atoms to which they are bonded a monocyclic or heterocyclic aliphatic, aromatic or heteroaromatic ring system which ring system is optionally substituted with one or more radicals $R^2$; and $R^2$ is identical or different on each occurrence selected from the group consisting of an aliphatic hydrocarbon having from 1 to 20 C atoms, an aromatic or heteroaromatic ring system with 5 to 30 aromatic ring atoms, in which one or more H atoms is optionally replaced by F, Cl, Br, I, CN or $NO_2$, wherein two or more adjacent substituents $R^2$ form together with the atoms to which they are bonded a mono- or polycyclic aliphatic, aromatic or heteroaromatic ring system.

6. The compound according to claim 5, wherein the compound is a compound of formula (13) or (14)

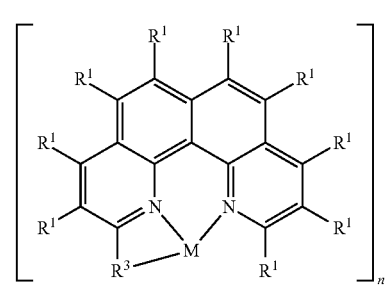

Formula (13)

-continued

Formula (14)

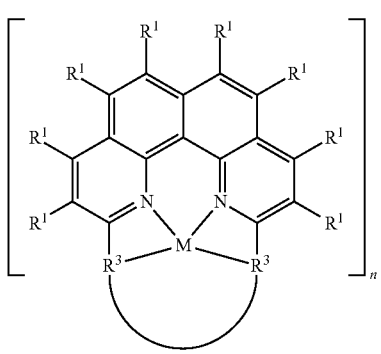

wherein

M is Zr, Hf, Mo, W, Ru, Os, Rh, Ir, Ni, Pt, Cu, Ag or Au;

$R^1$ is identical or different on each occurrence selected from the group consisting of H, D, F, Cl, Br, I, CN, $NO_2$, CNO, NCS, SCN, $CF_3$, a straight-chain alkyl, alkoxy or thioalkoxy group having from 1 to 40 carbon atoms or a branched, cyclic or polycyclic alkyl, alkoxy or thioalkoxy group having from 3 to 40 carbon atoms or an alkenyl or alkynyl group having from 2 to 40 carbon atoms, wherein optionally at least one of the carbon atoms of the alkyl, alkoxy, thioalkoxy, alkenyl or alkynyl group is substituted by one or more groups $R^2$, wherein optionally in each case one or more nonadjacent $CH_2$ groups is replaced by $-R^2C=CR^2-$, $-C\equiv C-$, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$; and wherein optionally one or more H atoms is replaced by F, Cl, Br, I, CN or $NO_2$; or an aromatic or heteroaromatic ring system having from 5 to 60 aromatic ring atoms which is optionally substituted by one or more radicals $R^2$, or an aryloxy or heteroaryloxy group having from 5 to 60 aromatic ring atoms which is optionally substituted with one or more radicals $R^2$, or a combination of said systems, wherein two or more adjacent substituents $R^1$ may form together with the atoms to which they are bonded a monocyclic or heterocyclic aliphatic, aromatic or heteroaromatic ring system which ring system is optionally substituted with one or more radicals $R^2$;

n is 1, 2 or 3;

$R^2$ is identical or different on each occurrence selected from the group consisting of an aliphatic hydrocarbon having from 1 to 20 C atoms, an aromatic or heteroaromatic ring system with 5 to 30 aromatic ring atoms, in which one or more H atoms is optionally replaced by F, Cl, Br, I, CN or $NO_2$, wherein two or more adjacent substituents $R^2$ form together with the atoms to which they are bonded a mono- or polycyclic aliphatic, aromatic or heteroaromatic ring system;

$R^3$ is a group coordinated to M and is selected such that a 5-, 6-, or 7-ring chelate is formed wherein $R^3$ bonds via the donor groups C, N, P, O or S.

7. An electronic component comprising an uncharged compound of the formula (1')

$$M(L)_n(L')_m(L'')_o \qquad \text{Formula (1')}$$

containing a substructure $M(L)_n$ of the formula (5) or (6)

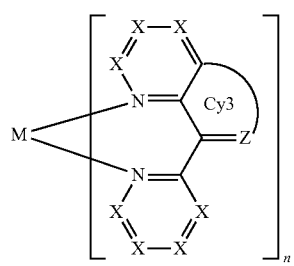

Formula (5)

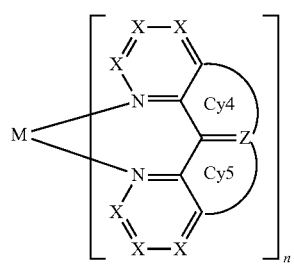

Formula (6)

wherein

Cy3, Cy4 and Cy5 are identical or different on each occurrence selected such that they form an aliphatic, aromatic or heteroaromatic ring system;

X is identical or different on each occurrence $C(R^1)$ or N provided that at maximum 2 adjacent X are represented by N;

$R^1$ is identical or different on each occurrence selected from the group consisting of H, D, F, Cl, Br, I, CN, $NO_2$, CNO, NCS, SCN, $CF_3$, a straight-chain alkyl, alkoxy or thioalkoxy group having from 1 to 40 carbon atoms or a branched, cyclic or polycyclic alkyl, alkoxy or thioalkoxy group having from 3 to 40 carbon atoms or an alkenyl or alkynyl group having from 2 to 40 carbon atoms, wherein optionally at least one of the carbon atoms of the alkyl, alkoxy, B thioalkoxy, alkenyl or alkynyl group is substituted by one or more groups $R^2$, wherein optionally in each case one or more nonadjacent $CH_2$ groups is replaced by $-R^2C=CR^2-$, $-C\equiv C-$, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$; and wherein optionally one or more H atoms is replaced by F, Cl, Br, I, CN or $NO_2$; or an aromatic or heteroaromatic ring system having from 5 to 60 aromatic ring atoms which is optionally substituted by one or more radicals $R^2$, or an aryloxy or heteroaryloxy group having from 5 to 60 aromatic ring atoms which is optionally substituted with one or more radicals $R^2$, or a combination of said systems, wherein two or more adjacent substituents $R^1$ may form together with the atoms to which they are bonded a monocyclic or heterocyclic aliphatic, aromatic or heteroaromatic ring system which ring system is optionally substituted with one or more radicals $R^2$;

Z is CR or N for formula (5);

Z is C for formula (6);

M is a transition metal;

R is identical or different on each occurrence and is in each case H, D, F, CN, a straight-chain alkyl or alkoxy group having from 1 to 40 carbon atoms or a branched or cyclic alkyl or alkoxy group having from 3 to 40 carbon atoms or an alkenyl or alkynyl group having from 2 to 40 carbon atoms, where in each case one or more non-adjacent CH$_2$ groups is optionally replaced by —R$^2$C=CR$^2$—, —C≡C—, Si(R$^2$)$_2$, Ge(R$^2$)$_2$, Sn(R$^2$)$_2$, —O—, —S—, —NR$^2$—, —(C=O)—, —(C=NR$^2$)—, —P=O(R$^2$)—, SO, SO$_2$ or —CONR$^2$— and one or more H atoms is optionally replaced by F, or an aromatic or heteroaromatic ring system having from 5 to 60 aromatic ring atoms or an aryloxy or a heteroaryloxy group having from 5 to 60 aromatic ring atoms which in each case is optionally substituted by one or more nonaromatic radicals R$^2$, or a combination of two, three or four of these systems;

R$^2$ is identical or different on each occurrence selected from the group consisting of an aliphatic hydrocarbon having from 1 to 20 C atoms, an aromatic or heteroaromatic ring system with 5 to 30 aromatic ring atoms, in which one or more H atoms is optionally replaced by F, Cl, Br, I, CN or NO$_2$, wherein two or more adjacent substituents R$^2$ form together with the atoms to which they are bonded a mono- or polycyclic aliphatic, aromatic or heteroaromatic ring system;

n is 1, 2 or 3;

wherein the ligands L' and L" in the formula (1) are identical or different and are selected from monodentate, bidentate or tridentate chelating ligands, which can also bind to the ligand L;

m and o are identical or different on each occurrence and are in each case 0, 1 or 2; and n+m+o=2 or 3;

with the proviso that when n=1 and L is part of a tetradentate ligand then the tetradentate ligand has no M-C bond; and wherein the electronic component is an organic light-emitting device/diode (OLED), an organic integrated circuit (O—IC), an organic field effect transistor (O-FET), an organic thin film transistor (O-TFT), an organic solar cell (O—SC), an organic light-emitting transistor (O-LET), an organic field quench device (O-FQD), a light-emitting electrochemical cell (LEC) or an organic laser diode (O-laser).

8. The electronic component according to claim 7, wherein the metal M is Zr, Hf, Mo, W, Ru, Os, Rh, Ir, Ni, Pd, Pt, Cu, Ag or Au.

9. The electronic component as claimed in claim 7, wherein the electronic component is an organic electroluminescent device, wherein the compound of the formula (1') is used as emitting material in an emitting layer, and/or is employed as matrix material for an emitting compound in an emitting layer and/or as hole-blocking material in a hole-blocking layer and/or as electron-transport material in an electron-transport layer and/or as hole-transport material in a hole-transport or a hole injection layer and/or as electron-blocking or exciton-blocking material in an exciton-blocking layer.

10. The electronic component as claimed in claim 7, wherein the electronic component is an organic electroluminescent device, wherein the compound of the formula (1') is used as emitting material in an emitting layer, and in combination with a matrix material selected from ketones, phosphine oxides, sulfoxides, sulfones, triarylamines, carbazole-derivatives, indolocarbazole derivatives, azacarbazoles, bipolar matrix materials, silanes, azaboroles, boronic esters, triazine derivatives or zinc complexes, and/or is employed as matrix material for an emitting compound in an emitting layer and/or as hole-blocking material in a hole-blocking layer and/or as electron-transport material in an electron-transport layer and/or as hole-transport material in a hole-transport or a hole injection layer and/or as electron-blocking or exciton-blocking material in an exciton-blocking layer.

11. A formulation comprising one or more compounds according to claim 1 and at least one solvent.

12. The compound according to claim 1, wherein the ligands L' and L" are selected from the group consisting of carbon monoxide;
NO;
Isonitriles;
amines;
phosphines;
phosphites;
arsines;
stibines;
nitrogen-containing heterocyclic compounds;
hydride;
deuteride;
the halides F, Cl, Br and I;
alkylacetylides;
arylacetylides;
cyanide;
cyanate;
isocyanate;
thiocyanate;
isothiocyanate;
aliphatic or aromatic alcoholates;
aliphatic or aromatic thioalcoholates;
amides;
carboxylates;
O$^{2-}$;
S$^{2-}$;
N$^{3-}$;
nitrenes, which result in coordination in the form R$^A$—N=M, wherein R$^A$ stands for a substituent;
diamines;
imines;
diimines;
diphosphines;
1,3-diketonates derived from 1,3-diketones;
3-ketonates derived from 3-ketoesters;
carboxylates derived from aminocarboxylic acids;
salicyliminates derived from salicylimines;
dialcoholates derived from dialcohols;
dithiolates derived from dithiols;
borates of nitrogen-containing heterocyclic compounds;
bidentate monoanionic ligands which, with the metal, form a cyclometallated five-membered ring containing at least one metal-carbon bond;
η$^5$-cyclopentadienyl;
η$^5$-pentamethylcyclopentadienyl;
η$^6$-benzene and
η$^7$-cycloheptatrienyl;
each of which is optionally substituted by one or more radicals R as defined in claim 1.

13. The compound according to claim 12, wherein the nitrogen-containing heterocyclic compounds are heterocyclic compounds containing two nitrogen atoms.

14. An oligomer, polymer or dendrimer comprising one or more uncharged compounds of the formula (1)

$$M(L)_n(L')_m(L'')_o \qquad \text{Formula (1)}$$

containing a substructure M(L)$_n$ of formula (5) or (6)

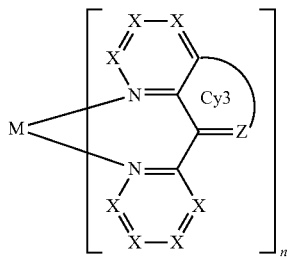

Formula (5)

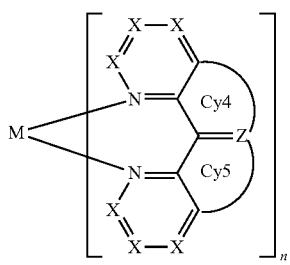

Formula (6)

wherein the symbols and indices used have the following meanings:

Cy3, Cy4 and Cy5 are identical or different on each occurrence selected such that they form an aliphatic, aromatic or heteroaromatic ring system;

X is identical or different on each occurrence C(R$^1$) or N provided that at maximum 2 adjacent X are represented by N;

R$^1$ is identical or different on each occurrence selected from the group consisting of H, D, F, Cl, Br, I, CN, NO$_2$, CNO, NCS, SCN, CF$_3$, a straight-chain alkyl, alkoxy or thioalkoxy group having from 1 to 40 carbon atoms or a branched, cyclic or polycyclic alkyl, alkoxy or thioalkoxy group having from 3 to 40 carbon atoms or an alkenyl or alkynyl group having from 2 to 40 carbon atoms, wherein optionally at least one of the carbon atoms of the alkyl, alkoxy, thioalkoxy, alkenyl or alkynyl group is substituted by one or more groups R$^2$, wherein optionally in each case one or more nonadjacent CH$_2$ groups is replaced by —R$^2$C=CR$^2$—, —C≡C—, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$; and wherein optionally one or more H atoms is replaced by F, Cl, Br, I, CN or NO$_2$; or an aromatic or heteroaromatic ring system having from 5 to 60 aromatic ring atoms which is optionally substituted by one or more radicals R$^2$, or an aryloxy or heteroaryloxy group having from 5 to 60 aromatic ring atoms which is optionally substituted by one or more radicals R$^2$, or a combination of said systems, wherein two or more adjacent substituents R$^1$ may form together with the atoms to which they are bonded a monocyclic or heterocyclic aliphatic, aromatic or heteroaromatic ring system which ring system is optionally substituted with one or more radicals R$^2$;

Z is CR or N for formula (5);
Z is C for formula (6);
M is Zr, Hf, Mo, W, Ru, Os, Rh, Ir, Ni, Pt, Cu, Ag or Au;
R is identical or different on each occurrence selected from the group consisting of H, D, F, CN, a straight-chain alkyl or alkoxy group having from 1 to 40 carbon atoms or a branched or cyclic alkyl or alkoxy group having from 3 to 40 carbon atoms or an alkenyl or alkynyl group having from 2 to 40 carbon atoms, where in each case one or more nonadjacent CH$_2$ groups is optionally replaced by —R$^2$C=CR$^2$—, —C≡C—, Si(R$^2$)$_2$, Ge(R$^2$)$_2$, Sn(R$^2$)$_2$, —O—, —S—, —NR$^2$—, —(C=O)—, —(C=NR$^2$)—, —P=O(R$^2$)—, SO, SO$_2$, or —CONR$^2$— and one or more H atoms is optionally replaced by F, or an aromatic or heteroaromatic ring system having from 5 to 60 aromatic ring atoms or an aryloxy or a heteroaryloxy group having from 5 to 60 aromatic ring atoms which in each case is optionally substituted by one or more nonaromatic radicals R$^2$, or a combination of two, three or four of these systems;

R$^2$ is identical or different on each occurrence selected from the group consisting of an aliphatic hydrocarbon having from 1 to 20 C atoms, an aromatic or heteroaromatic ring system having from 5 to 30 aromatic ring atoms, in which one or more H atoms is optionally replaced by F, Cl, Br, I, CN or NO$_2$, wherein two or more adjacent substituents R$^2$ form together with the atoms to which they are bonded a mono- or polycyclic aliphatic, aromatic or heteroaromatic ring system;

wherein at least one of the radicals R and R$^1$ of the formula (5) or at least one of the radicals R$^1$ of the formula (6) represents a bond to the oligomer, polymer or dendrimer;

n is 1, 2 or 3;

wherein the ligands L' and L" in the formula (1) are identical or different and are monodentate, bidentate or tridentate chelating ligands, which can also bind to the ligand L;

m and o are identical or different on each occurrence and are in each case 0, 1 or 2; and n+m+o=2 or 3;

with the proviso that when n=1 and L is part of a tetradentate ligand then the tetradentate ligand has no M-C bond;

and furthermore with the proviso that compounds of the following formula are excluded:

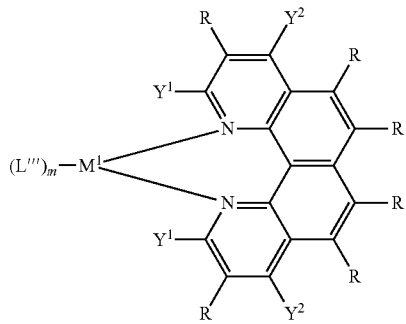

where R and m have the same meanings as specified above and furthermore:

M$^1$ is Zr, Hf, Mo, W, Ru, Os, Rh, Ir, Ni, Pt, Cu, Ag or Au;
Y$^1$ is identical or different on each occurrence H, halogen, a carboxyl, carboxylate, substituted or unsubstituted alkyl group, OH or amino group;
Y$^2$ is identical or different on each occurrence H, halogen, an alkoxy, OH, nitro or amino group;
L''' is a ligand.

15. A formulation comprising one or more oligomers, polymers or dendrimers according to claim 14 and at least one solvent.

* * * * *